(12) United States Patent
Maekawa et al.

(10) Patent No.: US 7,499,117 B2
(45) Date of Patent: Mar. 3, 2009

(54) LIQUID CRYSTAL DISPLAY DEVICE AND MANUFACTURING METHOD THEREOF

(75) Inventors: Shinji Maekawa, Shizuoka (JP);
Shunpei Yamazaki, Tokyo (JP);
Hideaki Kuwabara, Kanagawa (JP);
Yoshitaka Moriya, Kanagawa (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 98 days.

(21) Appl. No.: 10/577,058

(22) PCT Filed: Nov. 5, 2004

(86) PCT No.: PCT/JP2004/016782

§ 371 (c)(1),
(2), (4) Date: Apr. 24, 2006

(87) PCT Pub. No.: WO2005/047966

PCT Pub. Date: May 26, 2005

(65) Prior Publication Data

US 2007/0040971 A1    Feb. 22, 2007

(30) Foreign Application Priority Data

Nov. 14, 2003    (JP) .............................. 2003-386013

(51) Int. Cl.
*G02F 1/136* (2006.01)
(52) U.S. Cl. ........................................ 349/43; 349/122
(58) Field of Classification Search ............... 349/43
See application file for complete search history.

(56) References Cited

U.S. PATENT DOCUMENTS 5,308,998 A    5/1994    Yamazaki et al.
(Continued)

FOREIGN PATENT DOCUMENTS

CN    86103174    11/1986
(Continued)

OTHER PUBLICATIONS

International Search Report of Application No. PCT/JP2004/016782; PCT7506) Dated Dec. 21, 2004.
(Continued)

*Primary Examiner*—Frank G Font
*Assistant Examiner*—Eric Wong
(74) *Attorney, Agent, or Firm*—Nixon Peabody LLP; Jeffrey L. Costellia

(57) ABSTRACT

By using one photo mask in the manufacturing steps of a liquid crystal display device, steps such as resist coating, prebaking, exposure, development, and postbaking, as well as the formation of a covering film, etching, resist peeling, rinsing, drying and the like before and after the aforementioned steps are required, which make the process complicated. To solve the problem, a channel-etch type bottom gate TFT (inverted staggered TFT) is employed to pattern source and drain regions and a pixel electrode with the same mask. Moreover, according to the invention, among the patterns required to form a liquid crystal display device such as a conductive layer for a wiring layer or an electrode, a mask for forming a predetermined pattern and the like, at least one or more of them is formed by a method by which a pattern can selectively be formed, thereby manufacturing a liquid crystal display device.

30 Claims, 25 Drawing Sheets

U.S. PATENT DOCUMENTS

| | | | |
|---|---|---|---|
| 5,485,019 | A | 1/1996 | Yamazaki et al. |
| 5,521,107 | A | 5/1996 | Yamazaki et al. |
| 5,650,338 | A | 7/1997 | Yamazaki et al. |
| 6,013,928 | A | 1/2000 | Yamazaki et al. |
| 6,140,158 | A | 10/2000 | Rhee et al. |
| 6,599,582 | B2 | 7/2003 | Kiguchi et al. |
| 6,674,495 | B1 | 1/2004 | Hong et al. |
| 6,877,853 | B2 | 4/2005 | Kiguchi et al. |
| 7,114,802 | B2 | 10/2006 | Kiguchi et al. |
| 7,190,421 | B2 | 3/2007 | Hong et al. |
| 7,220,991 | B2 | 5/2007 | Hong et al. |
| 2001/0026347 | A1 | 10/2001 | Sawasaki et al. |
| 2002/0132396 | A1 | 9/2002 | Yamazaki et al. |
| 2003/0007108 | A1 | 1/2003 | Hwang et al. |
| 2003/0138998 | A1 | 7/2003 | Yamazaki et al. |
| 2003/0219934 | A1 | 11/2003 | Furusawa |
| 2006/0231846 | A1 | 10/2006 | Hong et al. |
| 2008/0030637 | A1 * | 2/2008 | Kawasaki ............ 349/43 |

FOREIGN PATENT DOCUMENTS

| | | | |
|---|---|---|---|
| CN | 1290922 | A | 4/2001 |
| EP | 0 206 481 | A2 | 12/1986 |
| EP | 0 930 641 | A2 | 7/1999 |
| JP | 62-131578 | | 6/1987 |
| JP | 64-068729 | | 3/1989 |
| JP | 01-248136 | | 10/1989 |
| JP | 05-283694 | | 10/1993 |
| JP | 11-204529 | | 7/1999 |
| JP | 2001-201750 | | 7/2001 |
| JP | 2001-250953 | | 9/2001 |
| JP | 2001-257350 | | 9/2001 |
| JP | 2003-318192 | | 11/2003 |
| JP | 2003-318401 | | 11/2003 |

OTHER PUBLICATIONS

Written Opinion (Application No. PCT/JP2004/016782; PCT7506) Dated Dec. 21, 2004.

Office Action (Application No. 200480033485.9; PCT CN7506), Dated: Aug. 31, 2007.

Notification of Second Office Action, The Patent Office of the People's Republic of China, Application No. 200480033485.9, dated Feb. 29, 2008 (with full translation).

Chinese Office Action (Application No. 200480033485.9; PCTCN7506) Dated Jun. 27, 2008 with English translation.

Chinese Office Action (Application No. 200480033485.9; PCTCN7506); dated Sep. 26, 2008 with English translation.

* cited by examiner

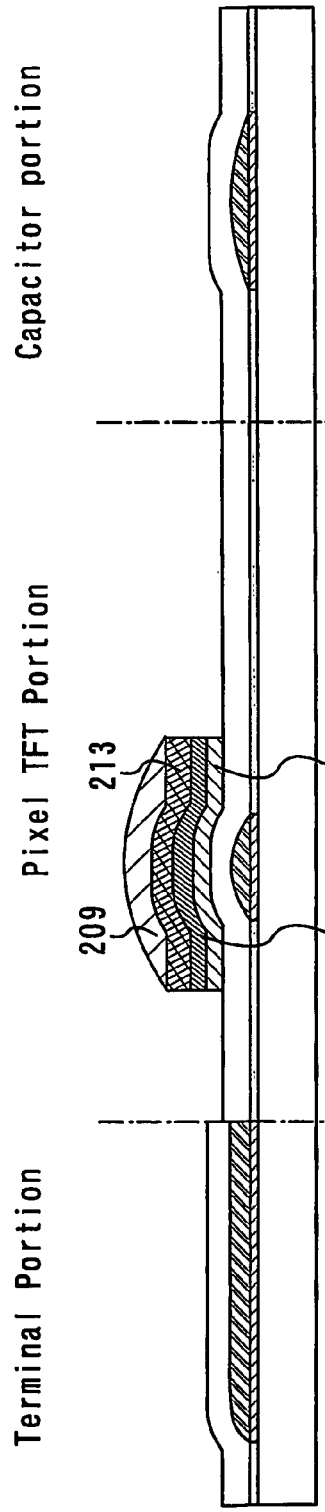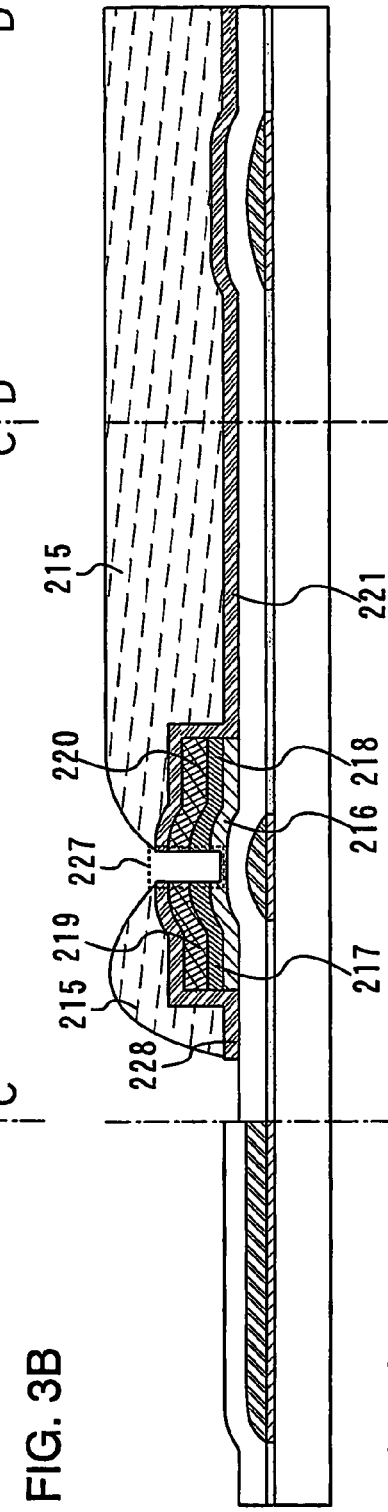

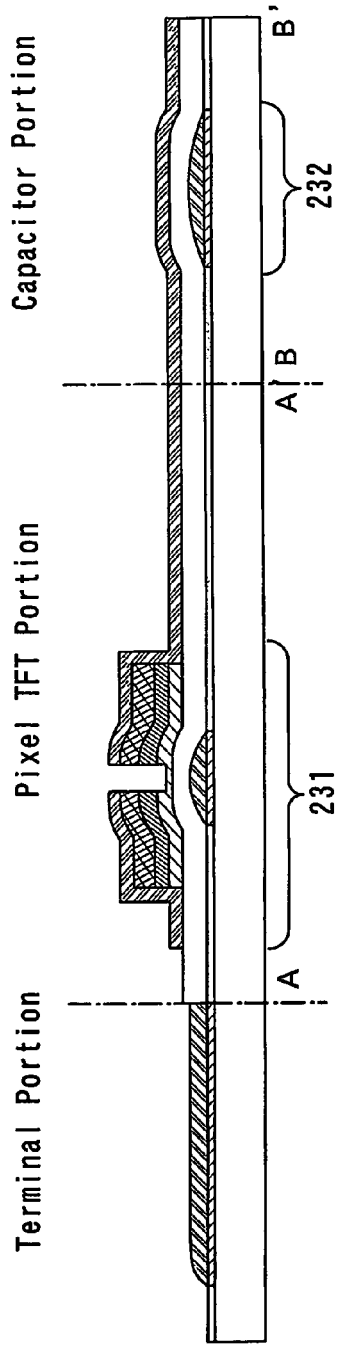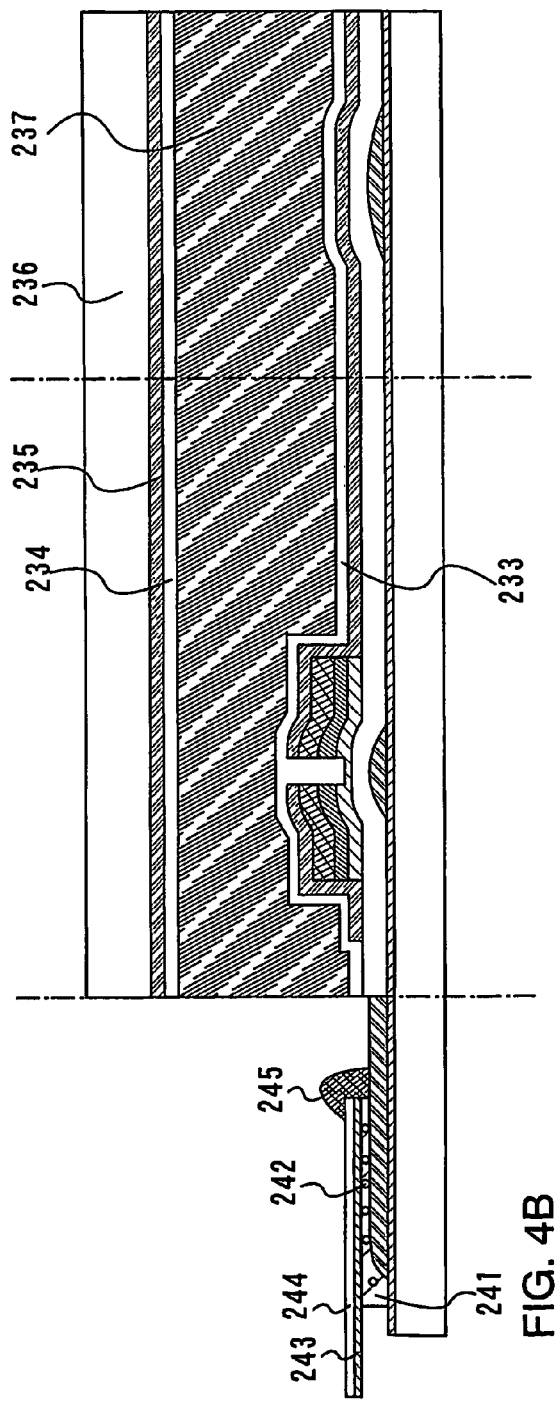
FIG. 4A
FIG. 4B

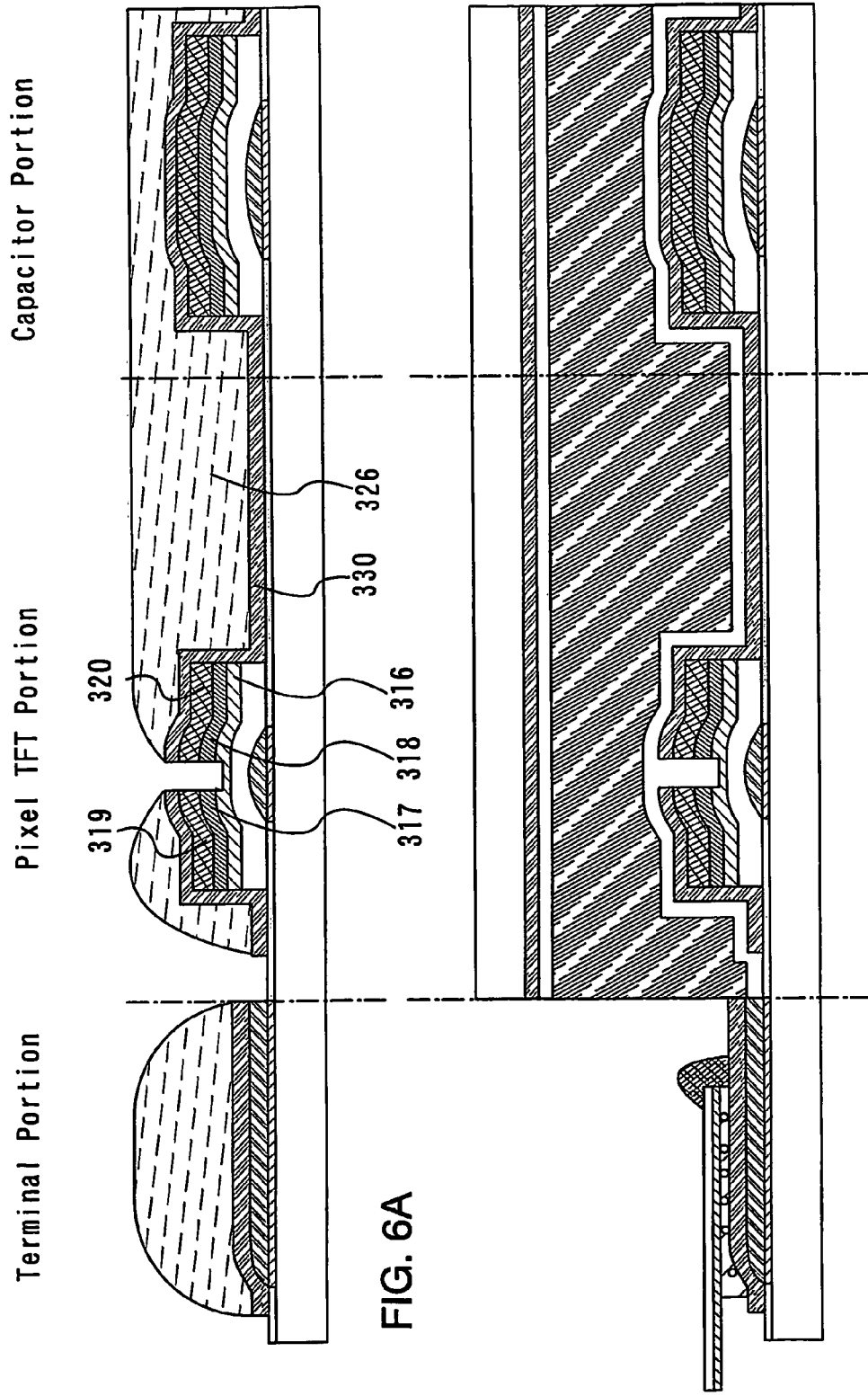

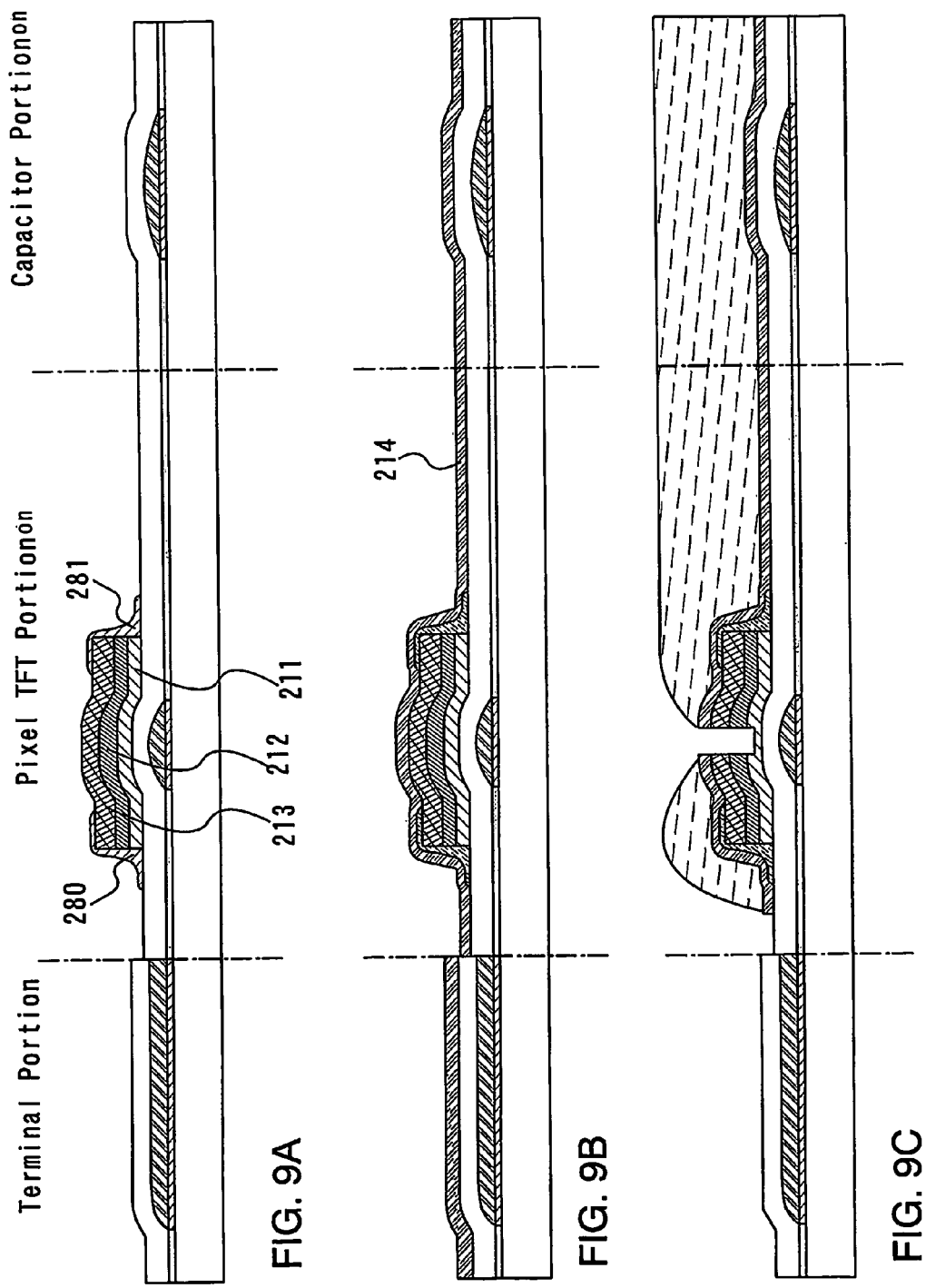

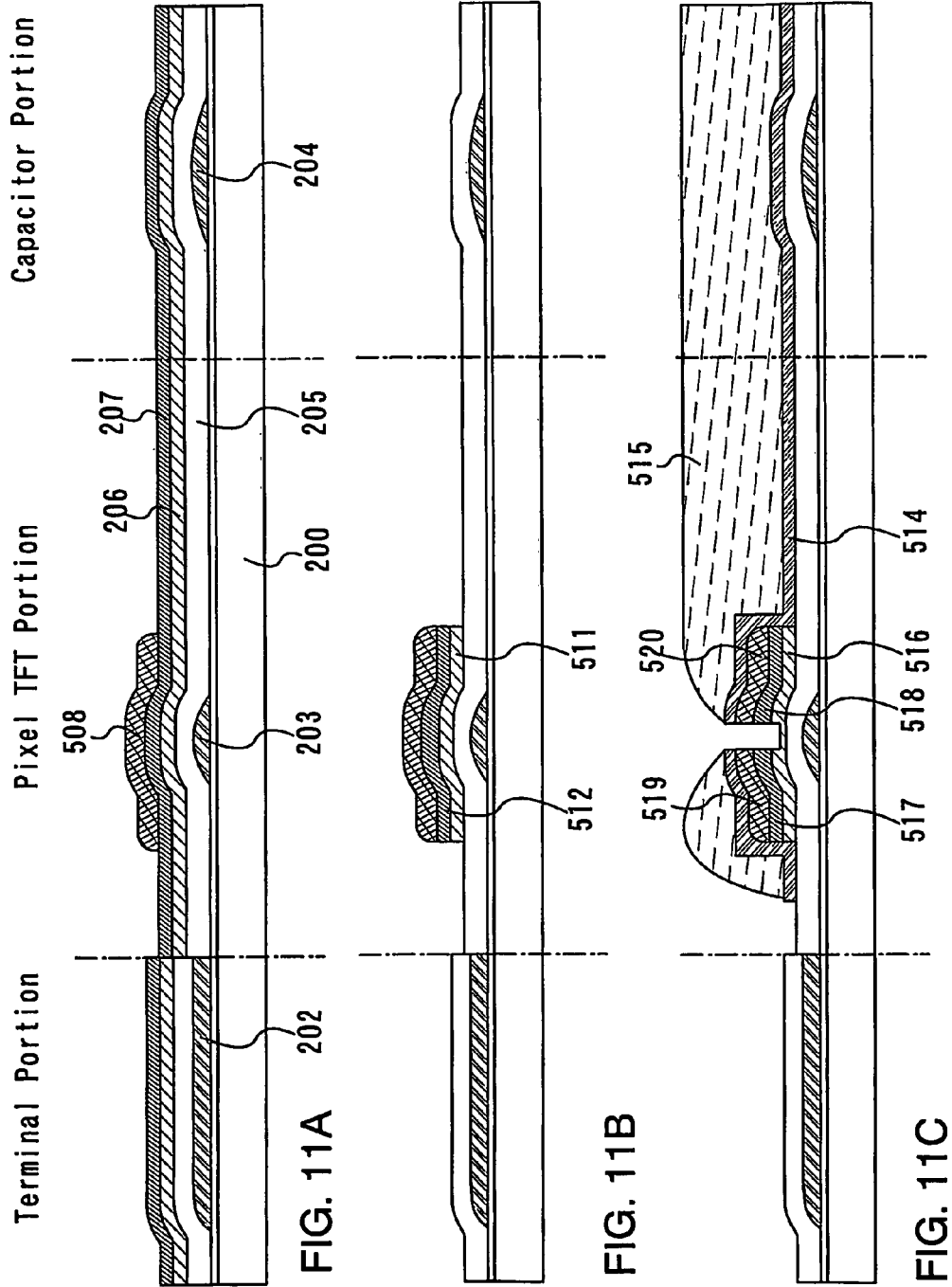

LIQUID CRYSTAL DISPLAY DEVICE AND MANUFACTURING METHOD THEREOF

TECHNICAL FIELD

The present invention relates to a liquid crystal display device having a circuit formed of a thin film transistor (TFT) and to a manufacturing method thereof.

BACKGROUND ART

In recent years, a technology to form a thin film transistor by using a semiconductor thin film (film thickness of about several nm to several hundred nm) formed on a substrate having an insulating surface is attracting attentions. A thin film transistor, which is widely applied to electronic devices such as an IC and an electronic optical device, is rapidly developed in particular as a switching element of an image display device.

In general, a liquid crystal display device is known as an image display device using a thin film transistor. An active matrix liquid crystal display device is becoming to be more used which can provide an image in higher resolution as compared to a passive matrix liquid crystal display device. In an active matrix liquid crystal display device, a pixel electrode provided in each of the pixels in matrix is selectively driven to form a display pattern on a display. That is, by applying a voltage between a selected pixel electrode and a counter electrode corresponding to the selected pixel electrode, a liquid crystal layer between the pixel electrode and the counter electrode is optically modulated. This optical modulation is recognized as a display pattern by an observer.

Application range of such an active matrix liquid crystal display device is expanding and demands for a high resolution, high aperture ratio, and high reliability are increasing in accordance with a display size becoming large. At the same time, demands for the improvement of productivity and cost reduction are increasing.

The production cost of a conventional active matrix liquid crystal display device is high since TFTs are formed on a substrate by using a number of photo masks by photolithography technology. In order to improve the productivity and yield, it is considered efficient to reduce the number of steps.

DISCLOSURE OF THE INVENTION

By using one photo mask in the manufacturing steps of a liquid crystal display device, steps such as resist coating, prebaking, exposure, development, and postbaking, as well as the formation of a covering film, etching, resist peeling, rinsing, drying and the like before and after the aforementioned steps are required, which make the process complicated.

In view of the aforementioned problem, according to the invention, the number of steps for forming a thin film transistor is reduced in order to reduce the production cost and improve the yield of an active matrix liquid crystal display device.

In order to solve the aforementioned problem, a channel-etch type bottom gate TFT structure (inverted staggered TFT) is employed to pattern a source region and a drain region, and a pixel electrode with the same mask. Moreover, according to the invention, among the patterns required to manufacture a liquid crystal display device such as a conductive layer for forming a wiring layer or an electrode, a mask for forming a predetermined pattern and the like, at least one or more of them is formed by a method by which a pattern can selectively be formed, thereby manufacturing a liquid crystal display device. As a method for selectively forming a pattern, a liquid droplet ejection method is used in which a liquid droplet of composition prepared for a specific purpose is selectively ejected to form a predetermined pattern for forming a conductive film, an insulating film and the like.

The invention is a liquid crystal display device comprising a gate wiring, a source wiring, a pixel electrode, and a thin film transistor. The gate wiring formed on an insulating surface, a semiconductor film formed on the gate wiring, a source region and a drain region formed on the semiconductor film, the source wiring formed on the source region, a drain electrode formed on the drain region, a barrier film formed so as to cover one end surface of the source wiring and the drain electrode, and the pixel electrode formed on the drain electrode and the barrier film are provided. The one end surface of the drain region approximately corresponds to the end surfaces of the semiconductor film and the drain electrode.

Further, according to the aforementioned structure of the invention, another end surface approximately corresponds to an end surface of the pixel electrode and another end surface of the drain electrode.

Further, the invention is a light-transmitting liquid crystal display device of which pixel electrode is formed of a light-transmitting conductive film.

Further, the invention is a reflective liquid crystal display device of which pixel electrode is formed of a film containing Ag (silver), Au (gold), Cu (copper), W (tungsten), and Al (aluminum) as its main component or lamination of these films.

Further, according to the aforementioned structure, the semiconductor film is a semi-amorphous semiconductor containing hydrogen and halogen element and having a crystalline structure.

According to the invention, composition is selectively ejected on an insulating surface to form a gate wiring, an insulating film that covers the gate wiring, a first semiconductor film on the insulating film, a second semiconductor film containing impurity elements which impart N-type on the first semiconductor film, and a first conductive film on the second semiconductor film. The first semiconductor film, the second semiconductor film, and the first conductive film are selectively removed by using a first mask to form a pattern of laminated films of the first conductive film, the second semiconductor film, and the first semiconductor film, and a second conductive film overlapped in contact with the laminated films. A portion of the first semiconductor film, the second semiconductor film, the first conductive film, and the second conductive film is selectively removed by using a second mask to form a source region and a drain region formed of the second semiconductor film and a pixel electrode formed of the second conductive film containing the impurity elements which impart N-type.

Further, according to the aforementioned structure of the invention, a barrier film is formed on an end surface of the laminated films of the first conductive film, the second conductive film, and the first semiconductor film by selectively ejecting composition.

Further, according to the invention, the insulating film, the first semiconductor film, the second semiconductor film, and the first conductive film are formed sequentially without being exposed to the atmosphere.

Further, according to the aforementioned structure, the first mask and the second mask are formed by selectively ejecting the composition. Further, the second conductive film is formed by selectively ejecting the composition.

Further, according to the aforementioned structure of the invention, a first conductive film is formed by selectively ejecting the composition containing conductive material and the first semiconductor film and the second semiconductor film are etched with the first conductive film as a mask.

According to the invention, as a wiring layer and a mask can be directly patterned by ejecting composition, utilization efficiency of material can be improved. Moreover, manufacturing steps of a liquid crystal display device can be simplified.

BRIEF DESCRIPTION OF THE DRAWINGS

FIGS. 3A to 3C are sectional diagrams showing manufacturing steps of a liquid crystal display device of the invention.

FIGS. 4A and 4B are sectional diagrams showing manufacturing steps of a liquid crystal display device of the invention.

FIGS. 6A and 6B are sectional diagrams showing manufacturing steps of a liquid crystal display device of the invention.

FIGS. 9A to 9C are sectional diagrams showing manufacturing steps of a liquid crystal display device of the invention.

FIGS. 11A to 11C are sectional diagrams showing manufacturing steps of a liquid crystal display device of the invention.

BEST MODE FOR CARRYING OUT THE INVENTION

Figure 1:
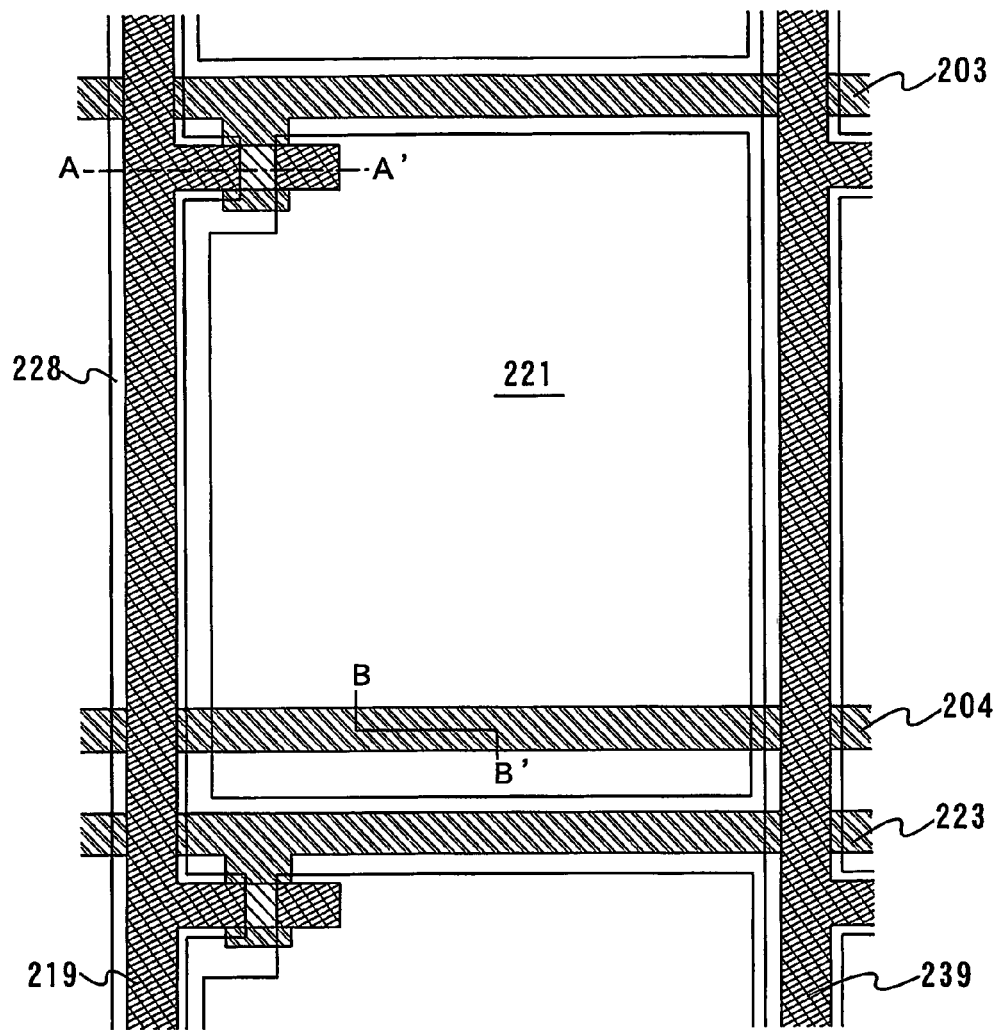
FIG. 1 is a top plan view of the invention.

Although the present invention will be fully described by way of example with reference to the accompanying drawings, it is to be understood that various changes and modifications will be apparent to those skilled in the art. Therefore, unless such changes and modifications depart from the scope of the present invention hereinafter defined, they should be construed as being included therein. Note that common portions among all the drawings are given the same reference numerals in the structure of the invention hereinafter described.

FIG. 1 is a plan view of a liquid crystal display device of the invention as an example. Here, one pixel configuration among a plurality of pixels arranged in matrix is shown for simplicity.

The pixel configuration shown in FIG. 1 includes a plurality of gate wirings 203 and 223 disposed in parallel to each other, a plurality of source wirings 219 and 239 arranged so as to cross each of the gate wirings 203 and 223. Further, a pixel electrode 221 formed of a light-transmitting conductive film is disposed in a region surrounded by the gate wirings 203 and 223, and the source wirings 219 and 239. Further, a light-transmitting conductive film 214 covers the source wirings so as not to overlap the pixel electrode 221.

Further, a capacitor wiring 204 is disposed between and in parallel with the two adjacent gate wirings 203 and 223 under the pixel electrode 221. This capacitor wiring 204 is provided in all pixels and forms a storage capacitor with an insulating film as a dielectric material which is provided between the pixel electrode 221.

Further, a switching element is provided around an intersection of the gate wiring 203 and the source wiring 219. A switching element is typically a TFT. A gate electrode side of a TFT is connected to a scan line while a source or a drain side is connected to a signal line, thereby each pixel can be controlled independently by a signal inputted externally.

The main components of a TFm are a semiconductor film, a gate insulating film, a gate electrode and the like, to which wirings connected to a source and a drain region formed on the semiconductor film are added. As a typical structure of a TFT, there are a top gate (staggered) type in which a semiconductor film, a gate insulating film, and a gate electrode layer are provided from a substrate side, and a bottom gate (inverted staggered) type in which a gate electrode layer, a gate insulating film and a semiconductor film are provided from a substrate side. In the invention, a bottom gate type TFT is used.

A more specific structure of a TFT is that a gate electrode (integrated with a gate wiring), a gate insulating film, a first semiconductor film, a source region and a drain region formed of a second semiconductor film containing impurity elements which impart N-type, a source electrode (integrated with a source wiring) and an electrode (hereinafter also referred to as a drain electrode) are laminated on an insulating substrate.

Further, a gate insulating film, a first amorphous semiconductor film, a second amorphous semiconductor film containing impurity elements which impart N-type are laminated under a source wiring (including a source electrode) and a drain electrode.

In the first amorphous semiconductor film, a region between a region in contact with the source region and a region in contact with the drain region has a thinner film thickness as compared to other regions. This is because a portion of the first amorphous semiconductor film is removed when forming the source region and the drain region by separating the second amorphous semiconductor film containing impurity elements which impart N-type by etching. Moreover, an end surface of the pixel electrode, an end surface of the drain electrode, and an end surface of the drain region approximately correspond to each other by the etching.

Similarly, an end surface of a wiring 228 which covers the source electrode, an end surface of the source electrode, and an end surface of the source region approximately correspond to each other.

A semiconductor film can be formed of an amorphous semiconductor (hereinafter also referred to as "AS") formed by using a semiconductor material gas typified by silane and germane by vapor deposition and sputtering, a polycrystalline semiconductor obtained by crystallizing the amorphous semiconductor by using light energy and heat energy, a semi-amorphous semiconductor (also referred to as a micro crystal hereinafter also referred to as "SAS") semiconductor and the like. Moreover, a TFT can be formed by using an organic.

An SAS is a semiconductor having an intermediate structure between an amorphous structure and a crystalline structure (including single crystal and polycrystal) and a third state that is stable in free energy. Moreover, an SAS includes a crystalline region having a short range order and lattice distortion. A crystalline region of 0.5 to 20 nm can be observed in at least a part of the film, and Raman spectrum is shifted to a lower frequency side than 520 cm$^{-1}$ in the case where silicon is a main component. Diffraction peaks of (111) and (220) are measured by X-ray diffraction, which are caused by Si crystal grating. Also, hydrogen or halogen of at least 1 atom % or more is included as a neutralizing agent of a dangling bond. An SAS is formed by depositing silicon gas by glow discharge (plasma CVD). The silicon gas is typically $SiH_4$, as well as $Si_2H_4$, $SiH_2Cl_2$, $SiHCl_3$, $SiCl_4$, $SiF_4$ and the like. Also, $GeF_4$ may be mixed as well. The silicon gas may be diluted with one or a plurality of noble gas elements such as $H_2$, $H_2$ and He, Ar, Kr, and Ne. The silicon gas is preferably diluted with the dilution ratio of 2 to 1000 times, at a pressure of approximately 0.1 to 133 Pa, and at a power supply frequency of 1 to 120 MHz, more preferably with a high frequency power of 13 to 60 MHz. It is preferable that a temperature for heating the substrate is 300° C. or less. It is preferable that impurities of atmospheric components such as oxygen, nitrogen, and carbon as impurity elements in the film be $1\times10^{20}$ cm$^{-1}$ or less. In particular, oxygen concentration is preferably $5\times10^{19}$/cm$^3$ or less and more preferably $1\times10^{19}$/cm$^3$ or less.

Figure 20:
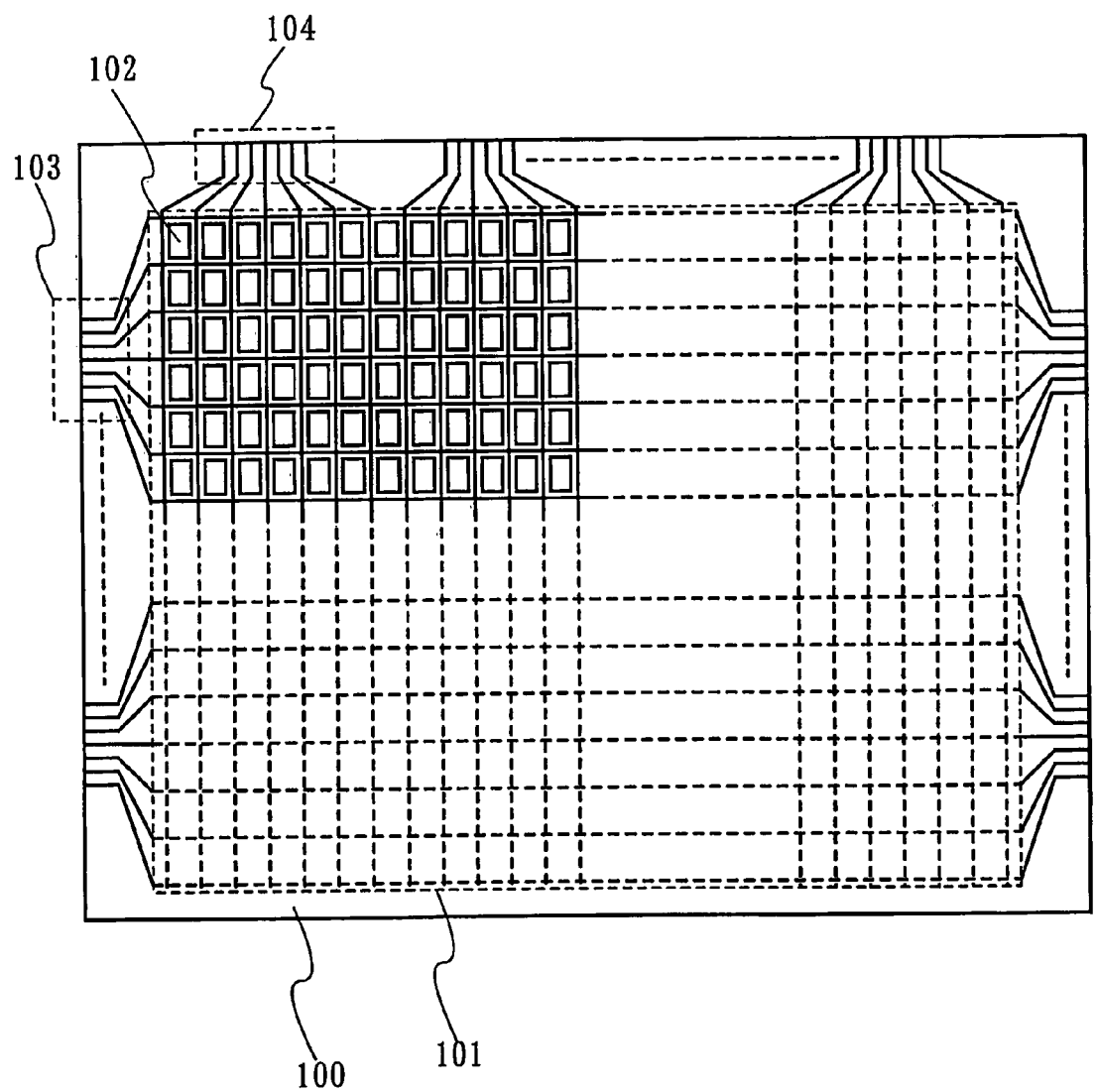
FIG. 20 is a top plan view showing a structure of a liquid crystal display device of the invention.
Figure 21:
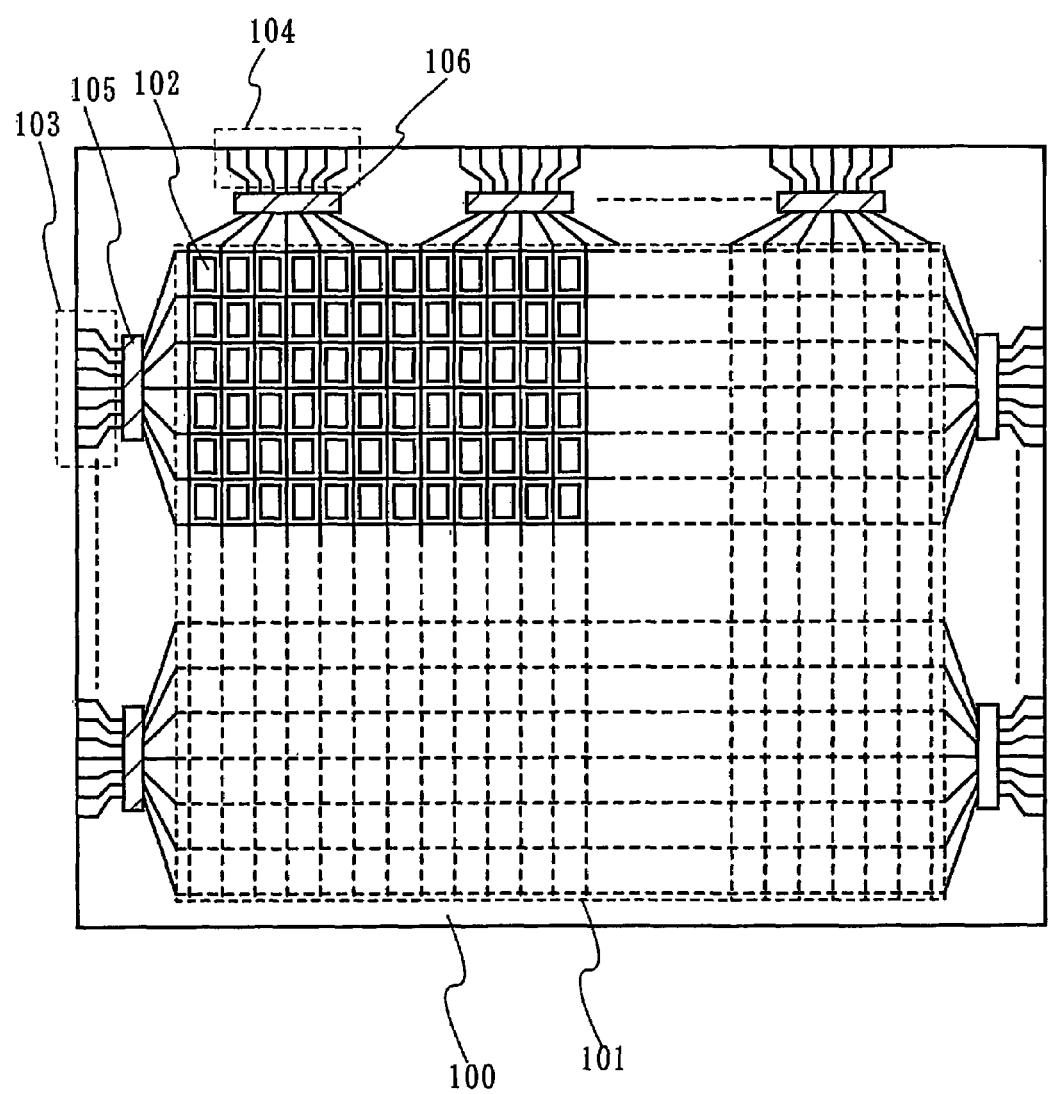
FIG. 21 is a top plan view showing a structure of a liquid crystal display device of the invention.
Figure 22:
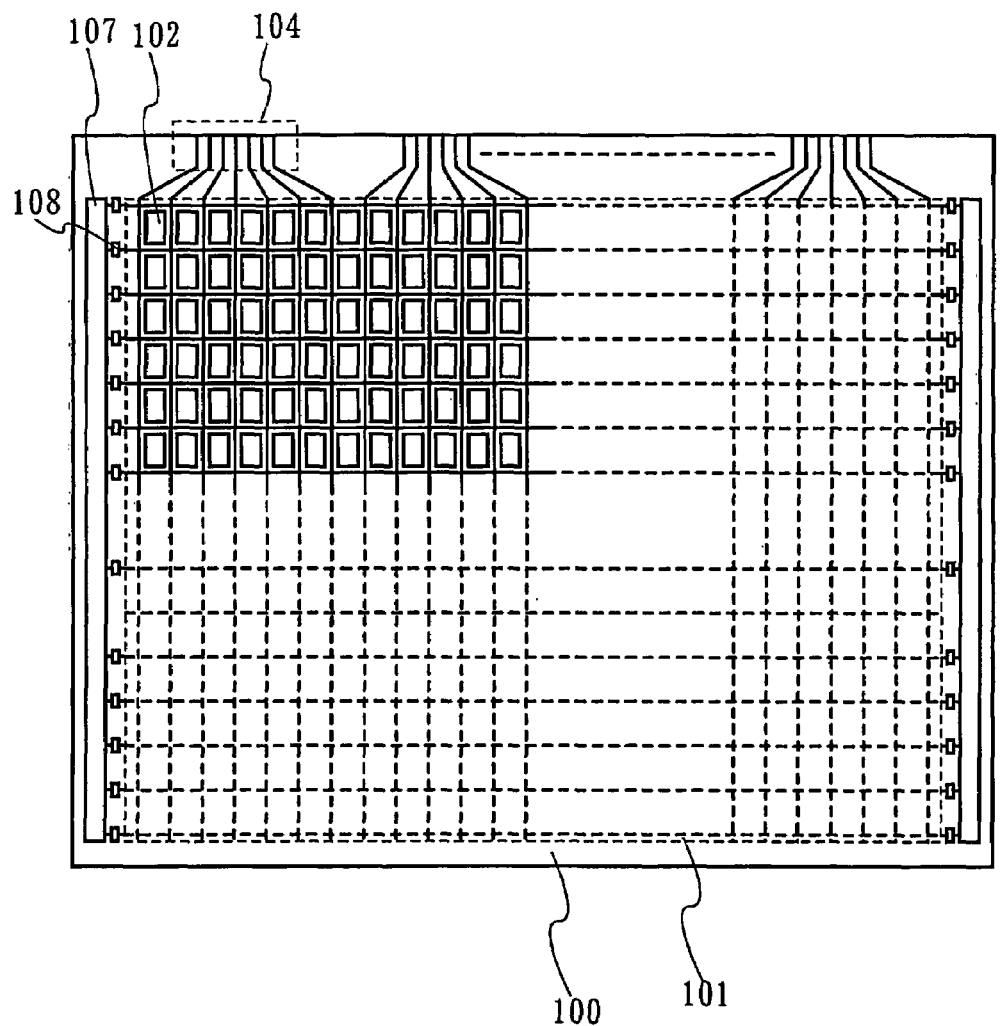
FIG. 22 is a top plan view showing a structure of a liquid crystal display device of the invention.

FIG. 20 is a top plan view showing an overall structure of a liquid crystal display panel according to the invention. A pixel portion 101 in which pixels 102 are arranged in matrix, scan line input terminals 103, signal line input terminals 104 are provided on a substrate 100 having an insulating surface. Here, FIG. 20 shows a structure of a liquid crystal display panel in which signals inputted to a scan line and a signal line are controlled by an external driver circuit, however, a driver IC 106 may be mounted on the substrate 100 by COG (Chip On Glass) as shown in FIG. 21. The driver IC 106 may be formed of a single crystalline semiconductor substrate and of a glass substrate on which a circuit is formed of a TFT. Further, in the case of forming a TFT provided in a pixel by an SAS, a scan line driver circuit 107 may be formed on the substrate 100 to be integrated as shown in FIG. 22.

According to the invention, a pattern of the aforementioned structure is directly formed by liquid droplet ejection method. Here, the liquid droplet ejection method is a method for selectively ejecting (discharging) forming liquid droplets (also referred to as dots) of composition containing materials for a conductive layer, an insulating film and the like to be formed on an arbitrary position, which is also referred to as an ink-jetting method depending on its system.

Figure 15:
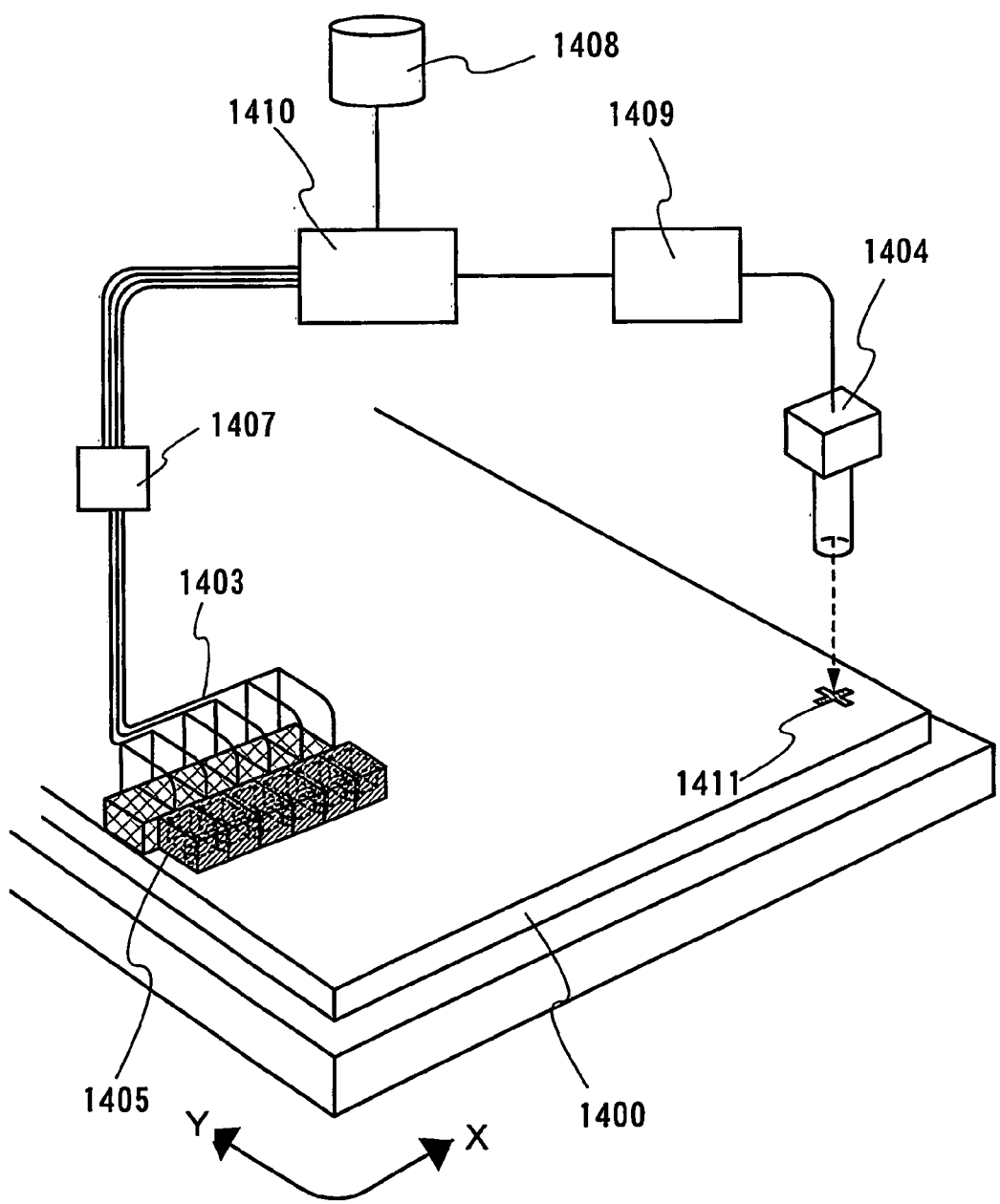
FIG. 15 is a diagram showing a structure of a liquid droplet ejection apparatus which can be applied to the invention.

FIG. 15 shows one mode of a liquid droplet ejection apparatus used for forming a pattern. Each head 1405 of a liquid droplet ejection means 1403 is connected to a control means 1407. A computer 1410 controls the control means 1407, thereby a programmed pattern can be drawn. A timing to draw may be, for example, determined on the basis of a marker 1411 formed on a substrate 1400. Alternatively, a base point may be determined on the basis of the edges of the substrate 1400. This is detected by an image pickup means 1404 such as a CCD, and converted into a digital signal by an image processing means 1409. The computer 1410 recognizes the digital signal and generates a control signal which is sent to the control means 1407. It is needless to say that data of patterns to be formed on the substrate 1400 are stored in a memory medium 1408, on the basis of which a control signal is sent to the control means 1407 and thus each head 1405 of the liquid droplet ejection means 1403 can be controlled independently. Note that a head may be scanned in X-Y direction for ejection as well. This is efficient in the case of ejecting on a larger substrate than a width of the head 1405 which ejects liquid droplets. Also, a device itself can be more compact.

Embodiment Mode 1

A manufacturing method of a channel-etch type thin film transistor is described as Embodiment Mode 1.

In this embodiment mode, a manufacturing method of a liquid crystal display device is described. A method for forming an inverted staggered TFT in a pixel portion on a substrate and a method for forming a storage capacitor connected to the TFT are described in details along the process. At the same time, a method for forming an input terminal portion provided in an end portion of the substrate for electrically connecting to a wiring of a circuit provided on another substrate is described.

Figure 2A:
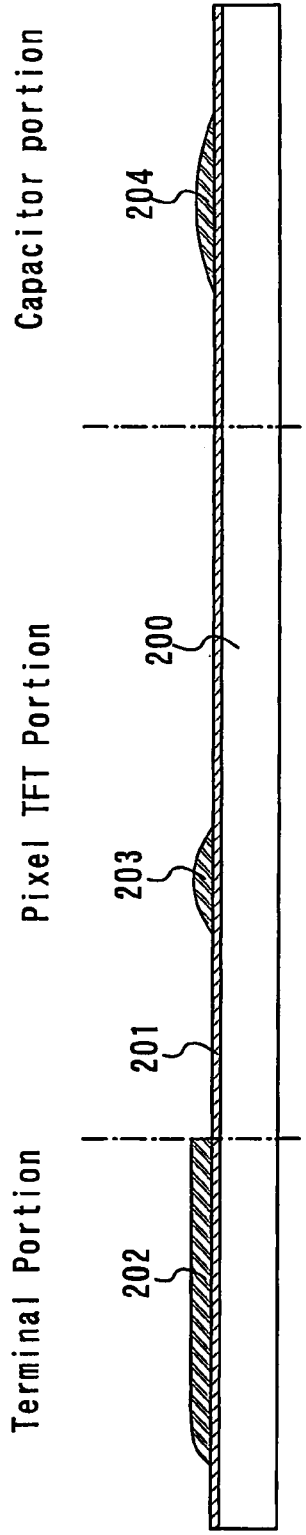
FIGS. 2A to 2C are sectional diagrams showing manufacturing steps of a liquid crystal display device of the invention.

In FIG. 2A, a substrate 200 may be a non-alkali glass substrate such as a barium borosilicate glass, an aluminoborosilicate glass, or an aluminosilicate glass fabricated by fusion method and a float method, a ceramic substrate as well as a plastic substrate which can resist the processing temperature of the present manufacturing steps, and the like. Further, a semiconductor substrate such as a single crystalline silicon, a metal substrate such as a stainless substrate on which an insulating layer is provided may be applied as well.

It is preferable that a conductive layer 201 formed of a metal material such as Ti (titanium), W (tungsten), Cr (chromium), Al (aluminum), Ta (tantalum), Ni (nickel), Zr (zirconium), Hf (hafnium), V (vanadium), Ir (iridium), Nb (niobium), Pd (palladium), Pt (platinum), Mo (molybdenum), Co (cobalt), or Rh (rhodium) which is formed by sputtering, vapor deposition and the like on the substrate 200. The conductive layer 201 may be formed in a thickness of 0.01 to 10 nm and can be formed in a single or a laminated structure. Note that the conductive layer 201 is provided for improving an adhesion of the gate electrode layer, therefore, provided that a sufficient adhesion can be obtained, the conductive layer 201 can be omitted and a gate electrode layer may be directly formed on the substrate 200.

Figure 16:
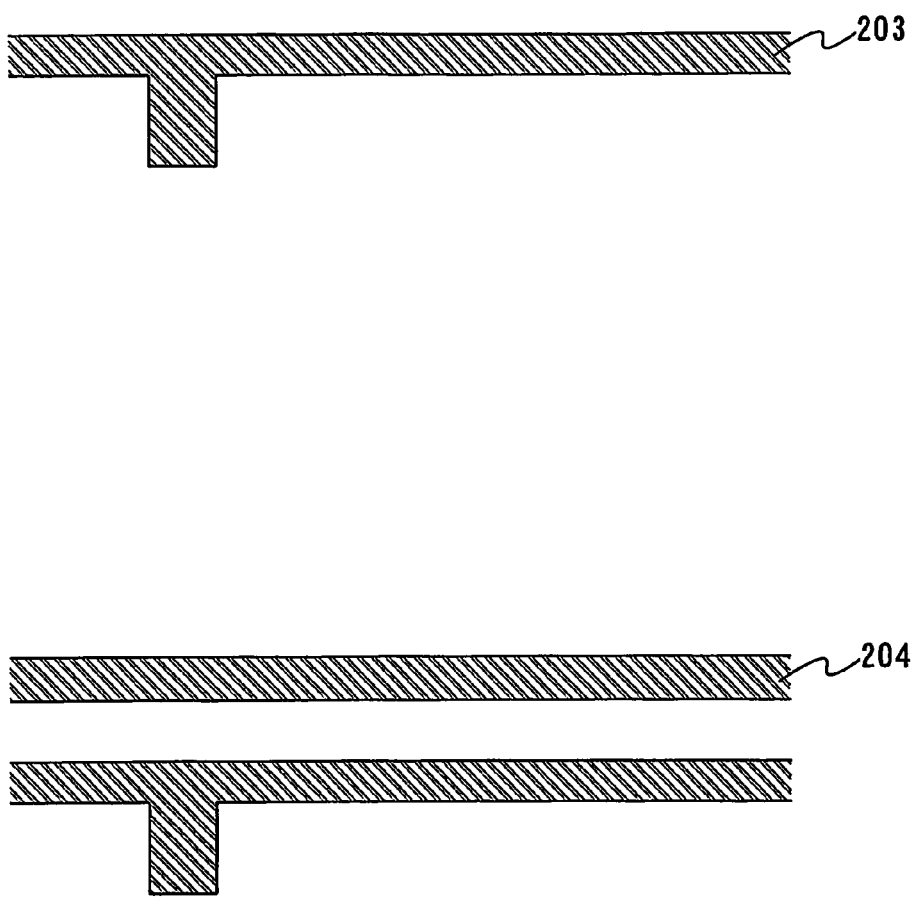
FIG. 16 are sectional diagrams showing manufacturing steps of a liquid crystal display device of the invention.

Subsequently, composition containing a conductive material is selectively ejected, thereby a gate wiring layer 202, a gate electrode layer 203, and a capacitor wiring layer 204 are formed on the conductive layer 201. (FIG. 2A) As a conductive material for forming these layers, composition having metal particles of Ag (silver), Au (gold), Cu (copper), W (tungsten), Al (aluminum), and the like as a main component can be used. Further, light-transmitting indium tin oxide (ITO), indium tin silicon oxide (ITSO) containing silicon oxide may be combined. In particular, it is preferable that the gate wiring layer is lower in resistance. Therefore, a material obtained by diluting or dispersing any one of gold, silver, or copper in a solvent is preferably used. More preferably, silver and copper which are low in resistance are used. In that case, however, a barrier film may be provided in combination in order to prevent impurities. A silicon nitride film and nickel boron (NiB) are used for a barrier film, for example. The solvent may be esters such as butyl acetate, alcohols such as isopropyl alcohol, organic solvents such as acetone, and the like. The surface tension and viscosity are appropriately controlled by controlling the concentration of the solvent and adding surfactant and the like. FIG. 16 shows a top plan view in this phase.

Moreover, the wiring layer may be formed by ejecting silver and copper plating thereafter. In this case, a wiring having a thin width is formed by ejecting composition, and after that, the wiring can be formed wider by plating. Also, rough surface of the ejected silver makes the plating easier. The plating may be performed by dipping a large substrate in a liquid tank or pouring plating solvent over the large substrate.

It is preferable that the diameter of a nozzle used in the liquid droplet ejection method be 0.02 to 100 μm (more preferably 30 μm or less) and the quantity of composition ejected from the nozzle be 0.001 to 100 pl (more preferably 10 pl or less). There are on-demand type and continuous type in the liquid droplet ejection method and either of them may be used. As for the nozzle used in the liquid droplet ejection method, either of a piezoelectric method that utilizes the property of a piezoelectric body which transforms when a voltage is applied, and a thermal method that composition is brought to boil by a heater provided in the nozzle for ejecting the composition may be used.

It is preferable that the object and a nozzle head be as close as possible in order to discharge the composition on a desired position. The distance is preferably about 0.1 to 3 mm (preferably 1 mm or less). One of the nozzle and the object moves while they keep a relative distance to each other, thereby a desired pattern is drawn. Further, the surface of the object may be subject to plasma treatment before the composition is ejected. By applying plasma treatment, the surface of the object can be hydrophilic or lyophobic. For example, the surface of the object becomes hydrophilic to pure water and lyophobic to paste that is diluted with alcohol.

A step for ejecting composition may be performed under reduced pressure. Accordingly, solvent of the composition is evaporated until the ejected composition lands on the object, thus steps for drying and baling can be omitted or shortened. After ejecting the composition, one or both of the steps for drying and baking is performed at normal pressure or under reduced pressure by irradiating laser light, rapid thermal annealing, furnace annealing and the like. The steps for drying and baking are both performed by heat treatment, however, the purposes, temperatures and time are different. For example, drying is performed at 100° C. for three minutes while baking is performed at 200 to 350° C. for 15 to 120 minutes. For performing the drying and baking favorably, a substrate may be heated in advance. The temperature is 100 to 800° C. (more preferably 200 to 350° C.) though it depends on the material of the substrate and the like. According to this step, the solvent in the composition is evaporated or dispersant is chemically removed and peripheral resin is cured and shrunk, thus fusing and welding are accelerated. The atmosphere for performing this step is oxygen atmosphere, nitrogen atmosphere, or atmospheric air. However, it is preferable to perform in the oxygen atmosphere since the solvent dissolved or dispersed with metal elements is easily removed.

The laser irradiation may be performed by using a gas laser or solid state laser of continuous oscillation or pulse oscillation. The former gas laser includes an excimer laser, a YAG laser and the like while the latter solid state laser includes a laser using a crystal, such as YAG and $YVO_4$ doped with Cr, Nd and the like. Note that it is preferable to use a continuous oscillation laser in view of the absorption rate of the laser light. Also, what is called a hybrid laser irradiation method may be used that the pulse oscillation and the continuous oscillation are combined. However, depending on the heat resistance of the substrate, the thermal treatment by laser irradiation is preferably performed instantaneously for several micro seconds to several ten seconds. The rapid thermal annealing (RTA) is performed in an inert gas atmosphere by using an infrared lamp, a halogen lamp and the like to irradiate ultraviolet light to infrared light, thereby the temperature is rapidly increased and heat is applied instantaneously for several micro seconds to several minutes. This treatment is performed instantaneously, therefore, an outermost thin film only can be heated practically without an effect on the underlayer films.

After forming the gate wiring layer 202, the gate electrode layer 203 and the capacitor wiring layer 204, it is preferable that one of the following two steps is performed to the conductive layer 201 which is exposed on the surface.

Figure 2B:
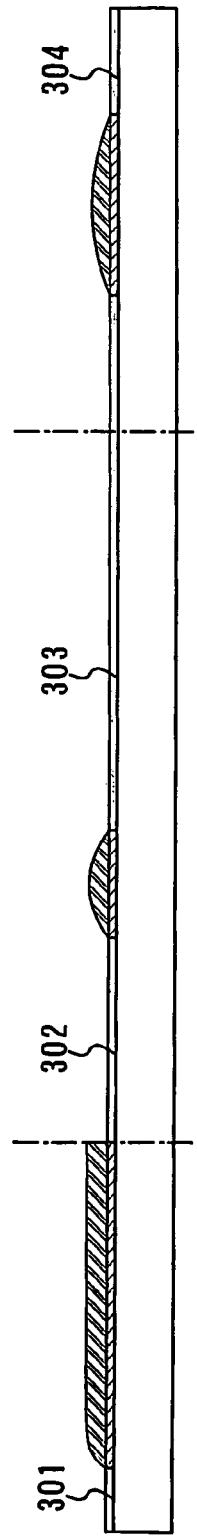
Figure 2C:
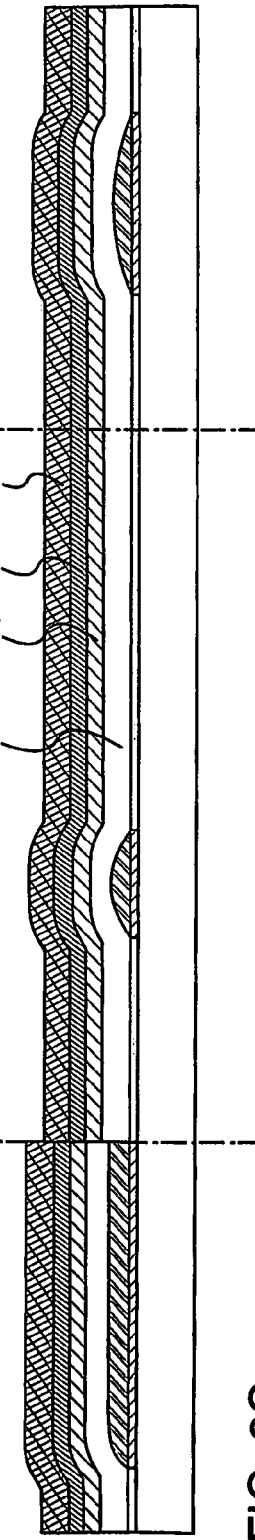

A first method is that the conductive layer 201 which is not overlapped with the gate wiring layer 202, the gate electrode layer 203 and the capacitor wiring layer 204 is insulated to form insulating layers 301 to 304. That is, the conductive layer 201 which is not overlapped with the gate wiring layer 202, the gate electrode layer 203 and the capacitor layer 204 is oxidized and insulated (FIG. 2B). In this manner, in the case of insulating the conductive layer 201, it is preferable to form the conductive layer 201 in a thickness of 0.01 to 10 nm, which is oxidized to be an insulating layer. Note that the conductive layer 201 may be oxidized by being exposed in oxygen atmosphere or applied thermal treatment.

A second method is that the conductive layer 201 is etched to be removed using the gate wiring layer 202, the gate electrode layer 203, and the capacitor layer 204 as masks. In the case of applying this step, thickness of the conductive layer 201 is not restricted.

Further, for forming the gate wiring layer 202, the gate electrode layer 203, and the capacitor wiring layer 204 on the substrate 200 by ejecting composition containing a conductive material, a following method may be applied instead of the aforementioned method in order to improve the adhesion between the substrate and the composition.

First, a base film is formed on the substrate 200 having an insulating surface. The base film is provided for preventing alkali metal and alkali earth metal such as Na contained in the substrate 200 from dispersing to a semiconductor film and adversely affecting the characteristics of a semiconductor element. Therefore, the base film can be formed by using an insulating film such as silicon oxide, silicon nitride, silicon nitride oxide, titanium oxide, and titanium nitride which can suppress dispersion of alkali metal and alkali earth metal to a semiconductor film. In particular, it is preferable that the base film is formed of a material that is highly adhesive to a material of the gate electrode. For example, in the case of using Ag, Cu or a lamination of Ag and Cu for the gate wiring layer, the gate electrode layer, or the capacitor wiring layer, it is preferable to form a base film formed of titanium oxide (TLOx). Note that the base film may have a single layer or laminated structure. Here, the base film has a laminated structure of a first base film and a second base film. As the first base film, a silicon oxynitride film is formed in thickness of 10 to 200 mm (more preferably 50 to 200 nm) by plasma CVD with source gases of $SiH_4$, $N_2O$, $NH_3$, and $H_2$, at a pressure of 0.3 Torr (39.9 Pa), an RF power of 50 W, an RF frequency of 60 MHz, and a substrate temperature of 400° C. As the second base film, a silicon oxynitride film is formed in thickness of 50 to 200 nm (more preferably 150 to 200 nm) by plasma CVD with source gases of $SiH_4$, and $N_2O$, at a pressure of 0.3 Torr (39.9 Pa), an RF power of 150 W, an RF frequency of 60 MHz, and a substrate temperature of 400° C.

In the case of using a substrate containing even a slight amount of alkali metal and alkali earth metal such as a stainless substrate or a plastic substrate, it is efficient to provide a base film in view of preventing dispersion of impurities. On the other hand, in the case where the dispersion of the impurities do not affect much such as a quartz substrate, a base film is not necessarily provided. That is, the base film is not necessarily required as long as the impurities can be prevented from dispersing to the semiconductor film. For example, in the case of forming a semiconductor film on a gate electrode with a gate insulating film interposed therebetween, the gate insulating film can prevent the impurities from dispersing to the semiconductor film, therefore, the base film is not required to be provided.

After that, plasma treatment is performed on the surface on which the gate electrode is to be formed. In this embodiment mode, the gate electrode is formed on the base film, therefore, plasma treatment is applied to the base film. The plasma treatment may be performed without contact to the surface on which the gate electrode is to be formed. The plasma treatment is performed with atmospheric air, oxygen or nitrogen as a process gas, and at a pressure of several ten to 800 Torr (106400 Pa), or more preferably 700 (93100 Pa) to 800 Torr (an atmospheric pressure or a pressure close to it). Moreover, the plasma treatment may be performed with an RF power source or an AC power source. For example, plasma is generated by using an AC power source with alternate voltage of 100V, frequency of 13.56 MHz and the like and changing the power. In order to discharge a stable plasma, a pulse is applied at an interval of voltage width of 2 to 4 μsec. By applying this plasma treatment, a surface is modified so that the surface becomes less wettable to liquid such as alcohol and oil. After that, the gate wiring layer, the gate electrode layer and the capacitor wiring layer are formed by ejecting the composition containing a conductive material on the substrate.

By using any one of the aforementioned methods, the gate wiring layer, the gate electrode layer and the capacitor wiring layer can be formed on the substrate 200.

Next, a gate insulating film 205 is formed in a single layer or a laminated structure by plasma CVD and sputtering. In particular, it is preferably formed by laminating three layers; an insulating film formed of silicon nitride, an insulating film formed of silicon oxide, and an insulating film formed of silicon nitride. Here, the gate insulating film 205 is shown as a single layer for simplicity. Note that in order to form a dense insulating film with less leak current at a low deposition temperature, it is preferable to include a noble gas element such as argon in reaction gas and mix it in the insulating film. By forming a first layer of silicon nitride or silicon nitride oxide which is in contact with the gate wiring layer 202, the gate electrode layer 203, and the capacitor wiring layer 204, deterioration due to oxidization can be prevented.

Next, a semiconductor film 206 is formed on the gate insulating film 205. The semiconductor film 206 is formed of an AS or an SAS formed by vapor deposition or sputtering using a semiconductor material gas typified by silane and germane.

In the case of employing plasma CVD, AS is formed by using $SiH_4$ or mixed gas of $SiH_4$ and $H_2$ which are semiconductor material gases. By diluting $SiH_4$ with $H_2$ 3 to 1000 times or diluting $Si_2H_6$ and $GeF_4$ at a gas flow ratio of 20 to 40:0.9, an SAS of which composition ratio of Si is 80% or more can be obtained. In particular, the latter is preferable since the semiconductor film 206 can have crystallinity at an interface between the base layer.

Next, an N-type or P-type semiconductor film 207 (hereinafter referred to as a semiconductor film 207) is formed on the semiconductor film 206, as a semiconductor containing impurity elements of one conductivity type. The semiconductor film 207 may be formed by using silane gas and phosphine gas and can be formed of an AS or an SAS.

Next, a conductive metal film 208 is formed by sputtering or vacuum deposition method. The conductive metal film 208 may be formed of any material as long as it is a metal material which can have an ohmic contact with the semiconductor film 207. An element selected from Al, Cr, Ta, and Ti, an alloy containing the aforementioned element, an alloy film in which the aforementioned elements are combined, and the like can be used.

By employing the aforementioned steps, the gate insulating film 205 to the metal film 208 can be formed sequentially without being exposed to the air. That is, an interface of each lamination can be formed without being contaminated by atmospheric components or impurity elements which float in the air, therefore, variation in characteristics of TFTs can be reduced.

Moreover, the metal film 208 can be formed by ejecting a conductive composition on the semiconductor film 207. The conductive material for forming the metal film 208 may be composition containing metal particles of Ag, Au, Cu, W, Al, and the like as a main component. Further, indium tin oxide which transmits light, ITSO formed of indium tin oxide and silicon oxide, organic indium, originating, zinc oxide, titanium nitride and the like can be used in combination as well.

Next, a mask 209 is formed by selectively ejecting composition on the metal film 208. As a material of the mask 209, resin material such as epoxy resin, acryl resin, phenol resin, novolac resin, melamine resin, and urethane resin is used. Further, organic material such as benzocychrobtenm, parylene, flare, polyimide which transmits light, a compound material formed by polymerization of siloxane polymers and the like, composition material containing water-soluble homopolymers and water-soluble copolymers may be used. Alternatively, a commercial resist material containing photosensitive agent may be used. For example, novolac resin as a typical positive type resist and naphthoquinone diazide compound as a photosensitive agent, a base resin as a negative type resist and diphenylsilanediol, an acid-forming agent and the like may be used. When using any of the aforementioned materials, the surface tension and viscosity are appropriately controlled by controlling the concentration of solvent and adding surfactant and the like.

A wiring and an electrode are formed by removing an unnecessary portion by etching with the mask 209 (FIG. 3A). Here, wet etching or dry etching can be used. At this time, the semiconductor film 206, the semiconductor film 207 and the conductive metal film 208 are etched to form a semiconductor film 211, a semiconductor film 212 containing one conductivity type impurity element (hereinafter referred to as a semiconductor film 212), and a conductive metal film 213 are formed in a pixel TFT portion. Further, the capacitor wiring 204 and the gate insulating film 205 are left in a capacitor portion and the terminal 202 and the gate insulating film 205 are left in a terminal portion as well.

Figure 8:
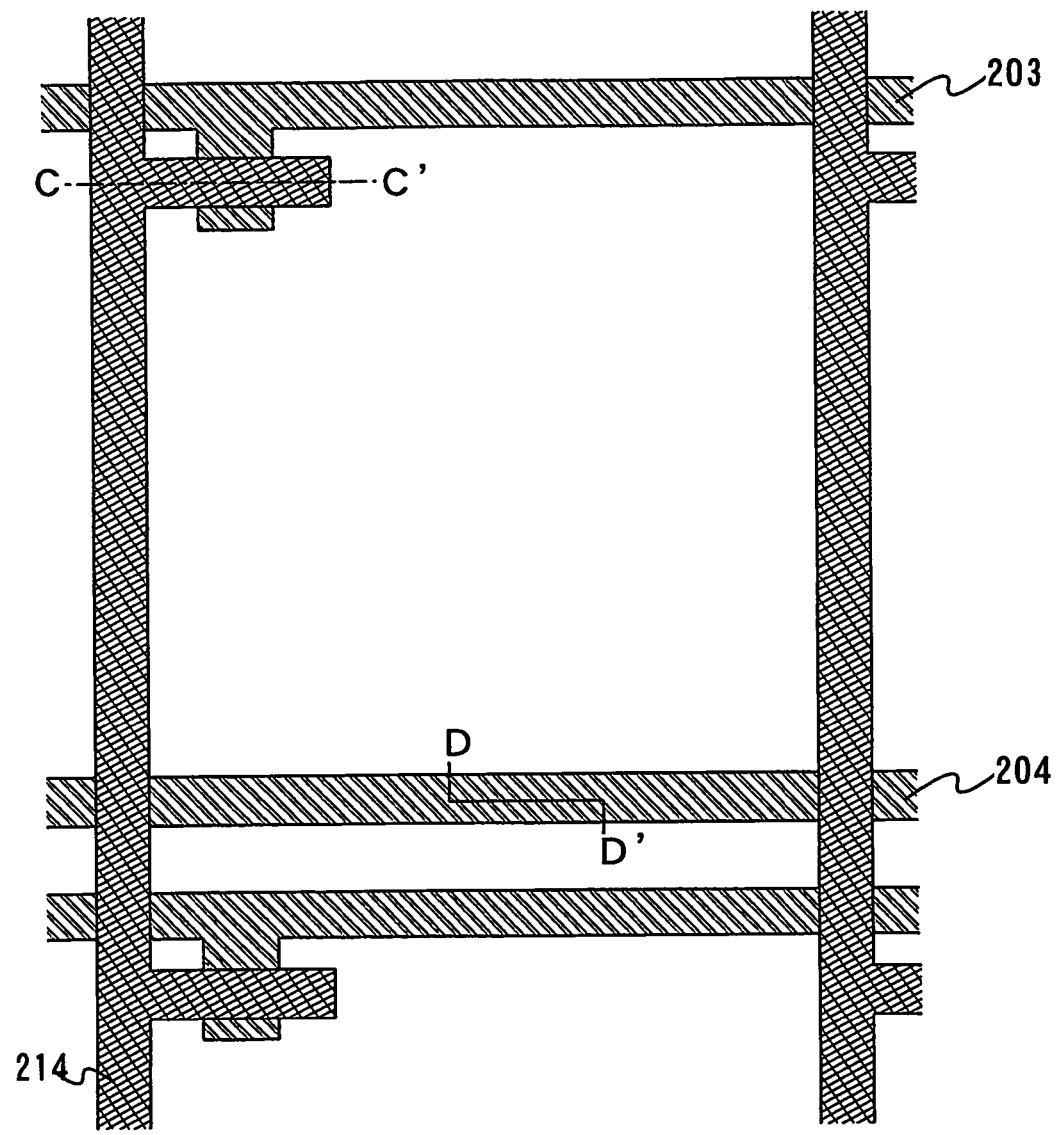
FIG. 8 is a sectional diagram showing a manufacturing step of a liquid crystal display device of the invention.

Next, a light-transmitting conductive film 214 is formed on the entire surface by ejecting composition containing a conductive material after removing the mask 209 (FIG. 3B). The top plan view here is shown in FIG. 8. However, the light-transmitting conductive film 214 deposited on the entire surface is not shown in FIG. 8 for simplicity.

In the case of manufacturing a liquid crystal display panel which transmits light, the light-transmitting conductive film 214 may be formed by forming and baking a predetermined pattern by composition containing indium tin oxide (ITO), indium tin oxide containing silicon oxide (ITSO), zinc oxide (ZnO), tin oxide ($SnO_2$) and the like. Further, in the case of manufacturing a liquid crystal display panel which reflects light, composition containing metal particles of Ag (silver), Au (gold), Cu (copper), W (tungsten), Al (aluminum) and the like can be used. Otherwise, a light-transmitting conductive film or a reflective conductive film may be formed by sputtering, and a mask pattern may be formed by liquid droplet ejection method, to which an etching step may be combined as well.

Next, a mask 215 is formed by selectively ejecting composition on the light-transmitting conductive film 214. A semiconductor film 216, a source region 217, a drain region 218, a source electrode 219, a drain region 220, and a pixel electrode 221 are formed by removing an unnecessary portion by etching (FIG. 3C).

Through this etching step, portions of the conductive metal film 213, the semiconductor film 212, and the semiconductor film 211 are simultaneously removed to form an aperture 227 while forming the light-transmitting conductive film 214 at the same time. In this embodiment mode, a pixel electrode formed of ITO is selectively removed by wet etching using a mixture of nitric acid and hydrochloric acid or ferric chloride solution, and portions of the conductive metal film 213, the semiconductor film 212, and the semiconductor film 211 are etched thereafter. Note that wet etching and dry etching are used in this embodiment mode, however, only dry etching may be performed by appropriately selecting reaction gas or only wet etching may be performed by appropriately selecting reactive solution.

Further, the aperture 227 reaches the semiconductor film 216, thus the semiconductor film 211 having a depressed portion is formed. By this aperture 227, the metal film 213 is separated into the source electrode 219 and the drain electrode 220, and the semiconductor film 212 is separated into the source region 217 and the drain region 218. The light-transmitting conductive film 228 in contact with the source electrode 219 covers a source wiring connected to the source electrode 219 and prevents electrostatic generated in a subsequent rubbing step, in particular.

In this embodiment mode, the light-transmitting conductive film 228 is formed on the source wiring, however, the light-transmitting conductive film 214 formed on the source electrode 219 or the source wiring may be removed when the aforementioned ITO film is etched. Moreover, a circuit for protecting from electrostatic may be formed by utilizing the aforementioned ITO film when etching the aforementioned ITO film.

Through this etching step, the light-transmitting conductive film 214 formed in the terminal portion is removed.

Moreover, a storage capacitor is formed of the capacitor wiring 204 and the pixel electrode 221 with the gate insulating film 205 in a capacitor portion as a dielectric.

Next, a mask is formed by selectively ejecting composition after removing the mask 215. Then, the gate insulating film 205 covering the gate wiring layer 202 in the terminal portion is selectively removed (FIG. 4A). Moreover, a resist mask may be formed by using a screen printing method or a shadow mask instead of the liquid droplet ejection method in which composition is ejected.

By using the mask selectively formed by ejecting composition in this manner, a pixel TFT portion having an inverted staggered TFT 231 and a storage capacitor 232 can be completed. Then, by forming a pixel portion by arranging these in matrix corresponding to each pixel, one substrate for manufacturing an active matrix liquid crystal display device can be formed. In this specification, such a substrate is referred to as an active matrix substrate for convenience.

Next, an alignment film 233 is selectively formed only in a pixel portion of the active matrix substrate. The alignment film 233 may be selectively formed by screen printing method or by forming a resist mask using a shadow mask after applying an alignment film, and removing it. An alignment film of a liquid crystal display device is typically formed of polyimide resin. Note that in this embodiment mode, an alignment film is formed after selectively removing the gate insulating film 205 covering the gate wiring layer 202 in the terminal portion, however, the gate insulating film 205 and the alignment film in the terminal portion may be removed simultaneously after forming an alignment film on the gate insulating film 205 covering the gate wiring layer 202 in the terminal portion.

After that, an insulating film 234 which functions as an alignment film, a counter substrate 236 provided with a conductive film 235 which functions as a counter electrode, and a TFT substrate 200 are attached with a spacer sandwiched therebetween. By providing a liquid crystal layer 237 in the space, a liquid crystal display panel can be manufactured.

Next, a flexible printed circuit (FPC) is connected to the input terminal 202 of the terminal portion. The FPC is formed of an organic resin film 244 such as polyimide and a copper wiring 243, and connected to the light-transmitting conductive film covering the input terminal with anisotropic conductive adhesive. The anisotropic conductive adhesive is formed by an adhesive 241 and particles 242 having conductive surfaces of several ten to several hundred μm diameters plated with gold and the like mixed therein. With these particles 242 in contact with the light-transmitting conductive film and the copper wiring 243 on the input terminal 202, electrical connections are formed therein. Further, a resin film 245 is provided for enhancing a mechanical strength of this portion. Through the aforementioned steps, a liquid crystal display panel containing a channel-etch type switching TFT and a capacitor is completed (FIG. 4B).

Figures 10A, 10B:
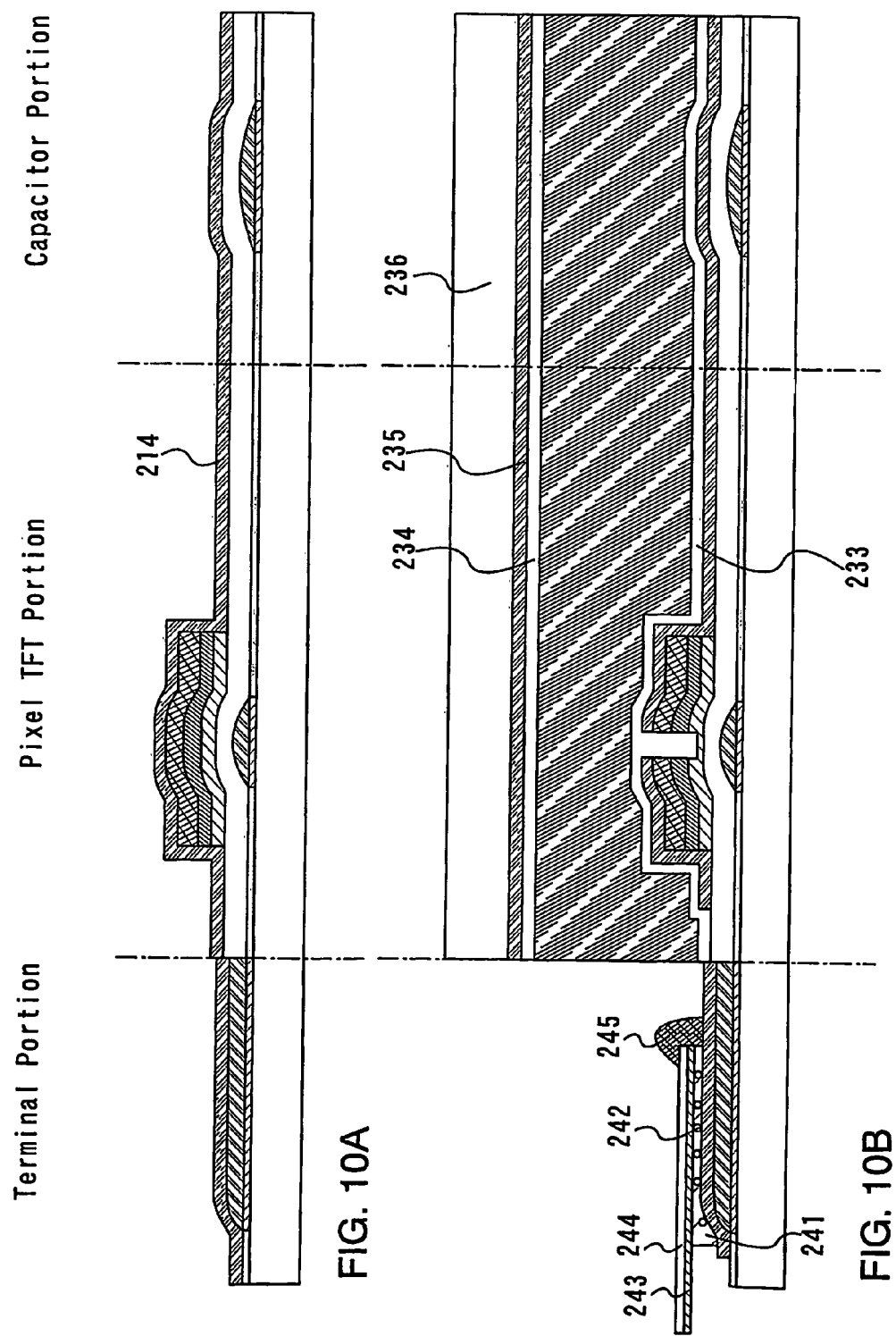
FIGS. 10A and 10B are sectional diagrams showing manufacturing steps of a liquid crystal display device of the invention.

Note that the light-transmitting conductive film 214 is formed on the gate insulating film 205 in the terminal portion in this embodiment mode (FIG. 3B), however, the gate insulating film 205 covering the input terminal 202 in the terminal portion may be removed before forming the light-transmitting conductive film 214 on the gate wiring layer 202. FIGS. 10A and 10B show steps in this case. Note that the portions corresponding to FIGS. 2A to 2C, 3A to 3C, 4A and 4B are denoted by the same reference numerals.

As described above, in this embodiment mode, a light exposure step by using a photo mask is unnecessary, therefore, a manufacturing step can be simplified.

Embodiment Mode 2

Figure 5A:
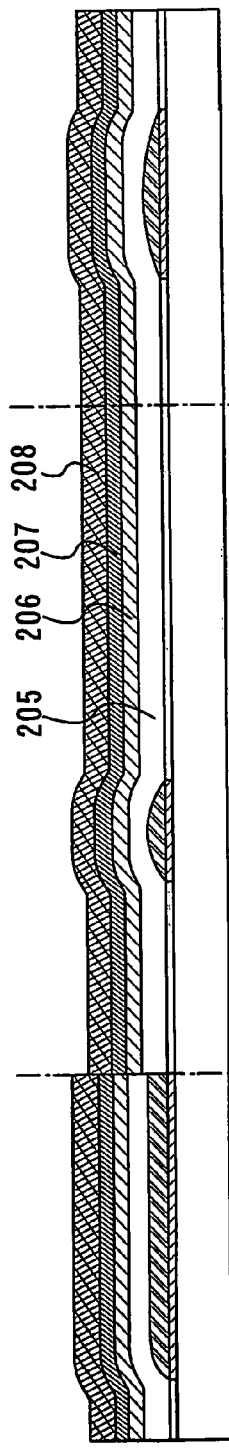
FIGS. 5A to 5C are sectional diagrams showing manufacturing steps of a liquid crystal display device of the invention.
Figure 5B:
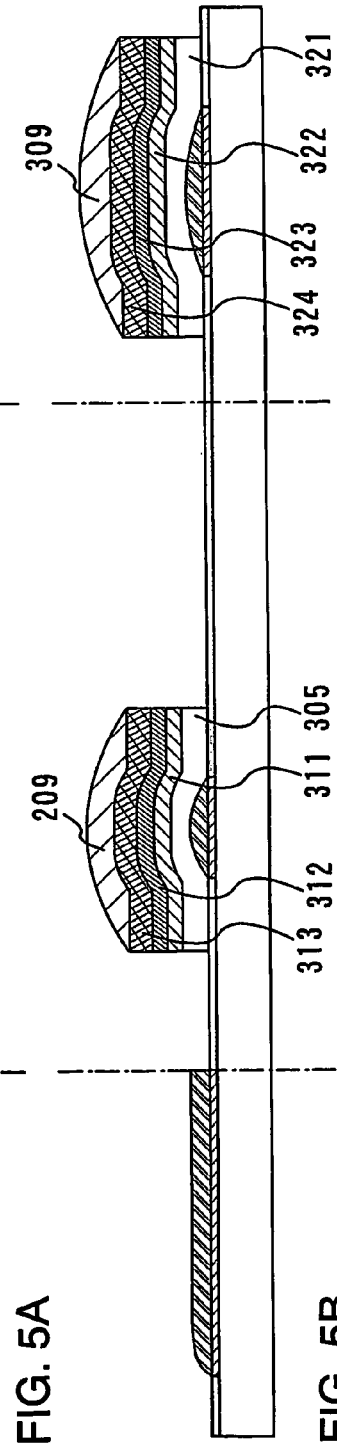
Figure 5C:
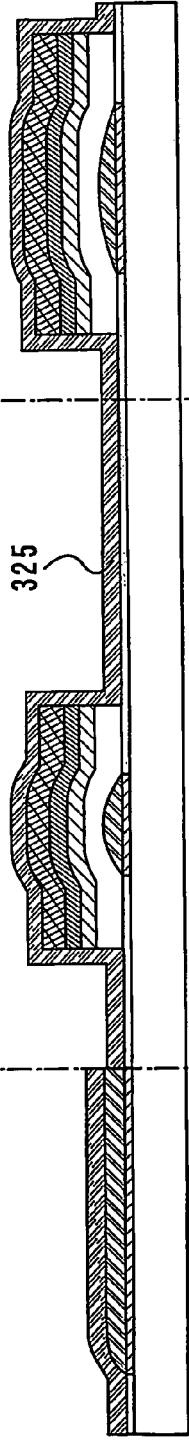

In this embodiment mode, a different mode than the aforementioned embodiment mode is described with reference to FIGS. 5A to 5C and 6A and 6B. In Embodiment Mode 1, the semiconductor film 206, the semiconductor film 207 and the metal film 208 are simultaneously etched as shown in FIG. 3A, however, the insulating film 205 may be etched at the same time as well. FIGS. 5A to 5C show steps in this case. Note that steps up to the formation of the metal film 208 may be similar to Embodiment Mode 1, therefore, description thereof is omitted here.

After the up to FIG. 5A, masks 209 and 309 are formed by selectively ejecting composition on the conductive film 208. Next, a wiring and an electrode are formed by removing an unnecessary portions by etching with the masks 209 and 309 (FIG. 5B), for which wet etching or dry etching is employed. At this time, the insulating film 205, the semiconductor film 206, the semiconductor film 207 and the metal film 208 are etched while an insulating film 305, a semiconductor film 311, a semiconductor film 312 containing impurity elements of one conductivity type, and a conductive metal film 313 are formed in a pixel TFT portion. Further, ends of these films are formed to be approximately the same plane.

In a capacitor portion, an insulating film 321, a semiconductor film 322, a semiconductor film 323 containing impurity elements of one conductivity type, and a conductive metal film 324 are formed. Similarly, ends of these films approximately correspond to each other.

The terminal portion is etched leaving the gate wiring layer 202 only. An insulating film on the gate wiring is removed leaving an intersection portion with other wirings. Accordingly, materials of the gate wiring layer 202 and the gate wiring and an insulating film are required to have sufficient selection ratio as well as a material of a terminal and a metal film. That is, the material of the terminal and the gate wiring and the material of the conductive metal film are different.

Next, a light-transmitting conductive film 325 is formed on the entire surface by ejecting composition containing a conductive material after removing the masks 209 and 309 (FIG. 5C). Subsequently, a mask 326 is formed by selectively ejecting composition on the light-transmitting conductive film 325, thereby a semiconductor film 316, a source region 317 and a drain region 318, a source electrode 319 and a drain region 320, and a pixel electrode 330 are formed by removing unnecessary portions by etching (FIG. 6A).

Through the aforementioned steps, a liquid crystal display panel shown in FIG. 6B is completed. Note that this embodiment mode can be freely implemented in combination with the aforementioned embodiment mode.

Embodiment Mode 3

Figure 7:
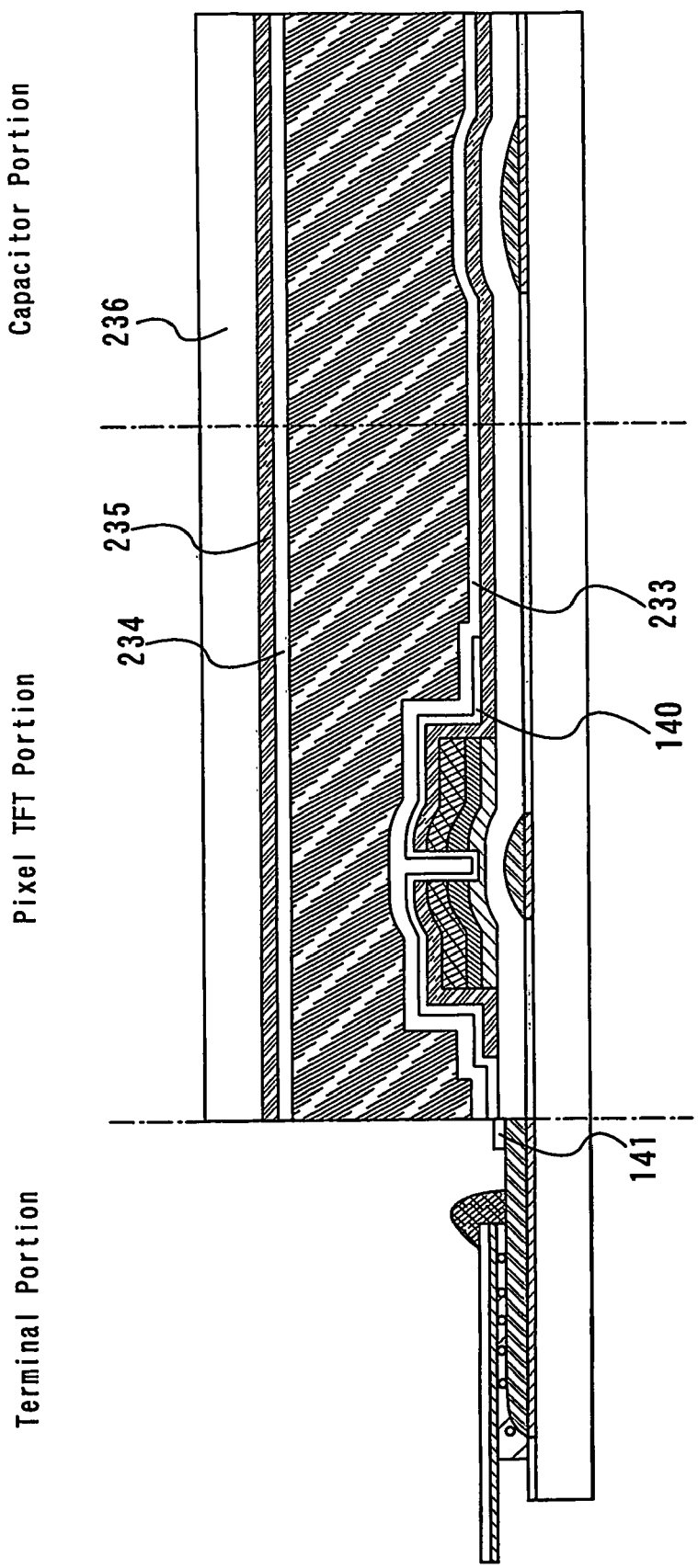
FIG. 7 is a sectional diagram of a liquid crystal display.

In this embodiment mode, a different mode than the aforementioned embodiment modes is described with reference to FIG. 7. Note that the same portions as those in the aforementioned embodiment modes are denoted by the same reference numerals in FIG. 7.

First, an insulating film as a protective film is formed after obtaining a state of FIG. 4A according to Embodiment Mode 1. The insulating film is formed by selectively ejecting composition. An insulating film 240 and an insulating film 241 are formed in a pixel TFT portion and a terminal portion respectively. Note that the insulating films 240 and 241 function as passivation films.

Moreover, an inorganic insulating film such as a silicon oxide film, a silicon nitride film, a silicon oxynitride film, and a tantalum oxide film may be formed in a single layer or a laminated structure. In this case, since a thin inorganic insulating film is formed on the entire surface, the insulating films 240 and 241 are formed by forming a mask by selectively ejecting composition on the insulating film and removing unnecessary portions by etching.

Thus, an inverted staggered TFr protected by an insulating film is completed without employing a light exposure step using a photo mask.

Note that this embodiment mode can be freely implemented in combination with the structure of Embodiment Mode 1 or 2.

Embodiment Mode 4

As Embodiment Mode 4, FIGS. 9A to 9C show the case of forming barrier films on end surfaces of an electrode and a wiring. In this embodiment mode, a different point than the aforementioned embodiments only is described hereafter since up to the state of FIG. 3A in Embodiment Mode 1 is the same. Further, portions corresponding to FIG. 3A are denoted by the same reference numerals.

First, the mask 209 is removed after obtaining the state of FIG. 3A according to Embodiment Mode 1. After that, barrier films 280 and 281 are formed on end surfaces of the semiconductor film 211, the semiconductor film 212 containing impurity elements of one conductivity type, and the metal film 213 by selectively ejecting composition.

The barrier films 280 and 281 are formed of a resin material such as a known conductive material, epoxy resin, acryl resin, phenol resin, novolac resin, melamine resin, and urethane resin. In the case of employing these resin materials, the viscosity thereof is preferably controlled by dissolving or dispersing by using solvent. Further, lyophobic resin is preferably used such as resin containing a fluoride atom or resin formed only of carbon hydride. More specifically, resin containing monomer including a fluoride atom in a molecular or resin containing monomer formed only of carbon and hydrogen atoms are used. Note that in the case of forming the barrier films by a conductive material, it is required to be formed so as not to short-circuit with a wiring. Therefore, the barrier films are preferably formed of resin material in a region that possibly short-circuits with a wiring. Further, there may be a break when forming the barrier films depending on a slope of the end surfaces. In order to prevent the break, one or a plurality of drops are baked after ejection for solidifying the composition, that is, ejection and baking are preferably performed repeatedly.

In general, a step is formed when a laminated structure of the semiconductor film 206, the semiconductor film 207 and the metal film 208 is simultaneously etched to form a pattern. Therefore, by forming barrier films on end surfaces of the semiconductor film 211, the semiconductor film 212 and the metal film 213, a break can be prevented when forming a light-transmitting conductive film. The barrier film is formed by controlling a quantity of ejection according to position so that a step of an end surface can be planarized.

As described in this embodiment mode, by providing barrier films on a portion having a step by selectively ejecting composition, a break can be prevented, thus the production yield can be improved. Further, a method described in this embodiment mode can be used to any portions as long as there is a step.

Note that this embodiment mode can be freely implemented in combination with the structures of Embodiment Modes 1 to 3.

Embodiment Mode 5

Figure 13:
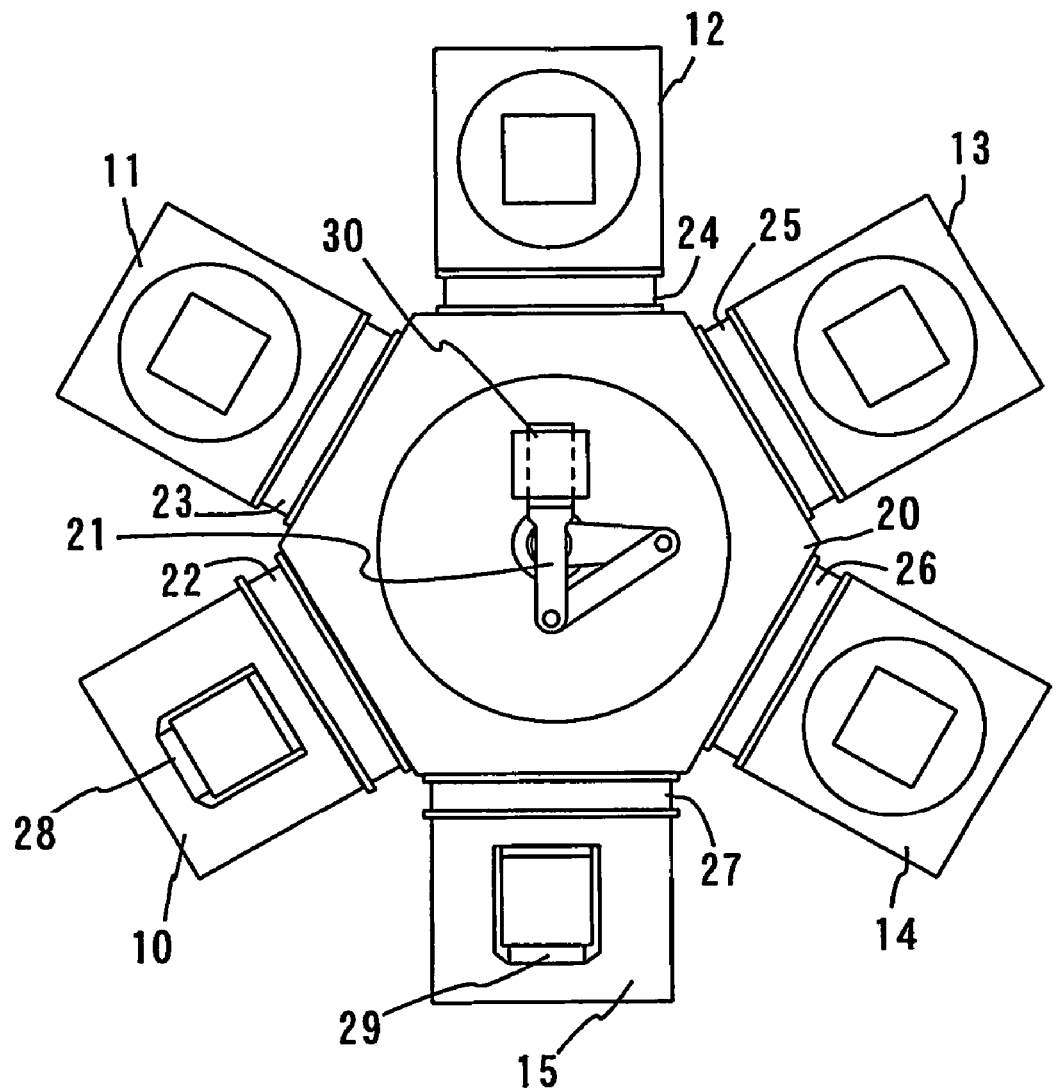
FIG. 13 is a top plan view of a manufacturing apparatus.

In Embodiment Mode 1, an insulating film, a first amorphous semiconductor film, a second amorphous semiconductor film containing impurity elements which impart N-type or P-type, and a first conductive film are sequentially laminated successively. FIG. 13 shows an example of an apparatus provided with a plurality of chambers used in the case of depositing sequentially in this manner.

FIG. 13 shows a schematic diagram of an apparatus (continuous deposition system) described in this embodiment seen from the top. In FIG. 13, reference numerals 10 to 15 denote chambers each having air tightness. Each of the chambers is provided with a vacuum evacuation pump and an inert gas inlet system.

The chambers denoted by 10 and 15 are load lock chambers for transferring a sample (processing substrate) 30 into the system. The chamber denoted by 11 is a first chamber for depositing an insulating film 104. The chamber denoted by 12 is a second chamber for depositing a first amorphous semiconductor film 105. The chamber denoted by 13 is a third chamber for depositing a second amorphous semiconductor film 106 which imparts N-type. The chamber denoted by 14 is a fourth chamber for depositing a first conductive film 107. Further, a chamber commonly provided for each chamber is a common chamber denoted by 20.

First, all the chambers are evacuated to a high vacuum and then purged with an inert gas which is nitrogen here (at normal pressure). Moreover, all gate valves 22 to 27 are closed.

First, a cassette 28 storing a number of processing substrates is transferred into the load lock chamber 10. After the transfer of the cassette 28, a door of the load lock chamber 10 which is not shown is closed. In this state, one processing substrate 30 is taken out of the cassette 28 by opening the gate valve 22, and then transferred to the common chamber 20 by a robot arm 21. At this time, an alignment is performed in the common chamber 20. Note that the wirings 202, 203 and 204 are formed on the substrate 30 that are obtained according to Embodiment Mode 1.

Here, the gate valve 22 is closed and the gate valve 23 is opened. Then, the processing substrate 30 is transferred to the first chamber 11. The processing substrate 30 is applied a film deposition process at 150 to 300° C. in the first chamber, thereby the gate insulating film 205 is obtained. Note that the insulating film may be a silicon nitride film, a silicon oxide film, a silicon nitride oxide film, or a lamination of these films. In this embodiment mode, a single layer of silicon nitride film is used, however, a lamination of two, three or more layers may be used as well. Note that the chamber that plasma CVD can be performed is used here, however, a chamber that sputtering by using a target can be performed may be used as well.

After depositing the insulating film, the processing substrate is taken out to the common chamber by the robot arm and transferred to the second chamber 12. In the second chamber 12, a film deposition process is applied at 150 to 300° C. similarly to the first chamber 11 and the first amorphous semiconductor film 105 is obtained by plasma CVD. Note that the first amorphous semiconductor film may be a micro crystal semiconductor film, an amorphous germanium film, an amorphous silicon germanium film, or a lamination of these films. Further, thermal treatment for reducing a hydrogen concentration may be omitted by setting a temperature for forming the first amorphous semiconductor film at 350 to 500° C. Note that the chamber that plasma CVD can be performed is used here, however, a chamber that sputtering by using a target can be performed may be used as well.

After depositing the first amorphous semiconductor film 105, the processing substrate is taken out to the common chamber and transferred to the third chamber 13. In the third chamber 13, a film deposition process is applied at 150 to 300° C. similarly to the second chamber 12 and the second amorphous semiconductor film 106 containing impurity elements (P or As) which impart N-type is obtained by plasma CVD. Note that the chamber that plasma CVD can be performed is used here, however, a chamber that sputtering by using a target can be performed may be used as well.

After depositing the second amorphous semiconductor film 106 containing impurity elements which impart N-type, the processing substrate is taken out to the common chamber and transferred to the fourth chamber 14. In the fourth chamber 14, the first conductive film 107 is obtained by sputtering by using a metal target. Note that the first conductive film may be formed by ejecting composition containing a conductive material as described in Embodiment Mode 1, which can be selected by a practitioner appropriately.

The processing substrate sequentially deposited with four layers is transferred to the load lock chamber 15 by the robot arm and stored in the cassette 29.

It is needless to say that the apparatus shown in FIG. 13 is only an example. Further, this embodiment can be freely implemented in combination with any one of Embodiment Modes 1 to 4.

Embodiment Mode 6

In Embodiment Mode 6, a different mode than Embodiment Mode 5 is described with reference to FIG. 14. Specifically, a plurality of chambers are used to laminate films sequentially in Embodiment Mode 5, however, only one chamber is used for sequentially laminating layers while keeping the high vacuum therein by using the apparatus shown in FIG. 14.

Figure 14:
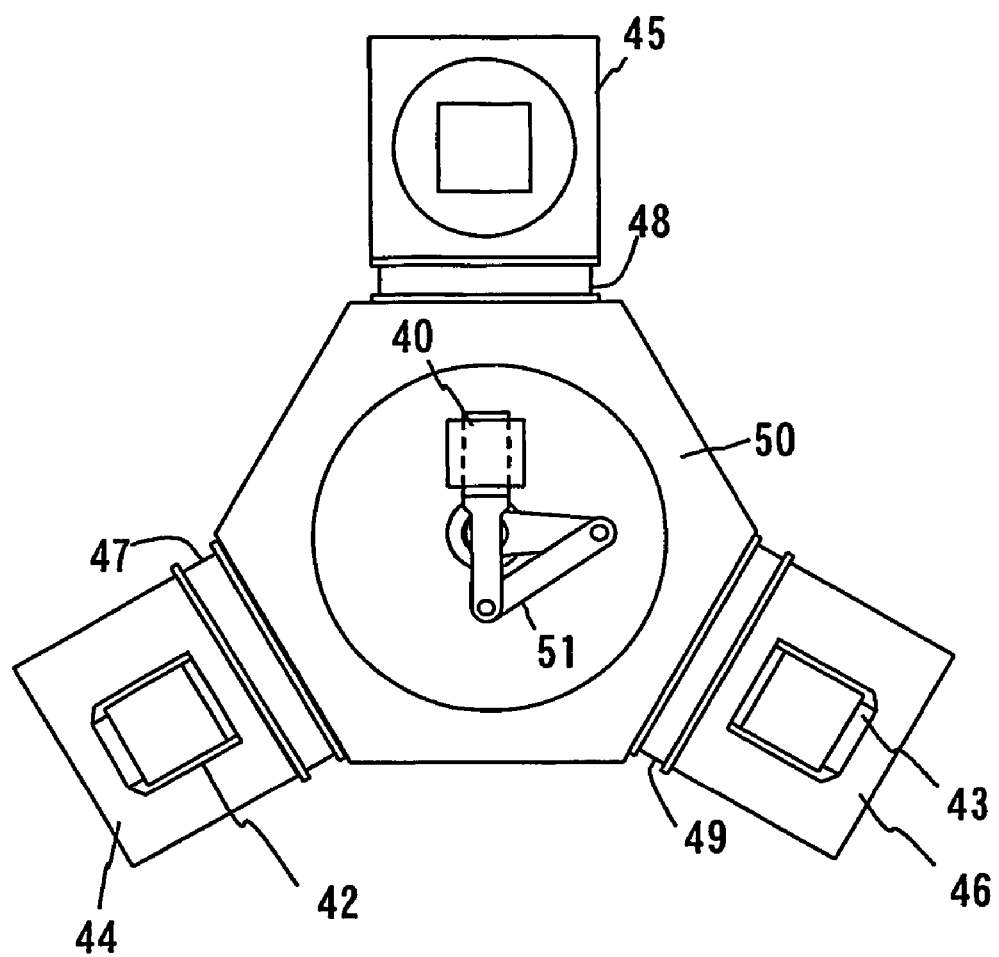
FIG. 14 is a top plan view of a manufacturing apparatus.

In this embodiment mode, a system shown in FIG. 14 is used. In FIG. 14, reference numeral 40 denotes a processing substrate, 50 denotes a common chamber, 44 and 46 denote load lock chambers, 45 denotes a chamber, and 42 and 43 denote cassettes. In this embodiment mode, the same chamber is used for laminating layers in order to prevent contamination generated when the substrate is transferred.

This embodiment mode can be freely implemented in combination with any one of Embodiment Modes 1 to 4.

For example, in the case of applying to Embodiment Mode 1, a plurality of targets are provided in the load lock chamber 45. Then, by exchanging reaction gas sequentially, the insulating film 205, the first amorphous semiconductor film 206, the second amorphous semiconductor film 207 containing impurity elements which impart N-type, and the first conductive film 208 are laminated.

Embodiment Mode 7

Figure 12:
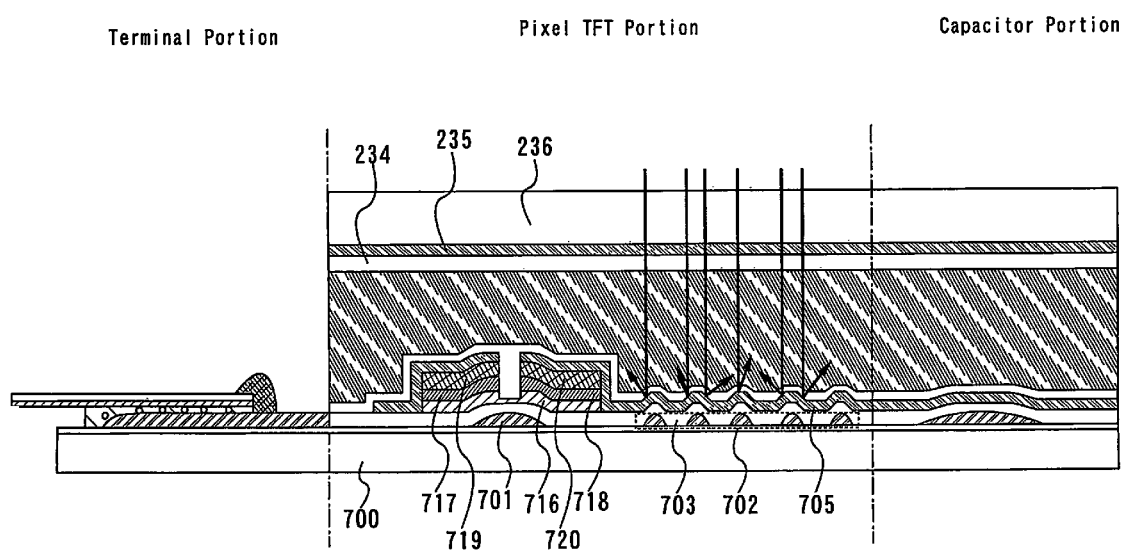
FIG. 12 is a sectional diagram of a reflective electronic optical device.

In this embodiment mode, an example of applying the invention to a reflective liquid crystal display device is described with reference to FIG. 12.

First, a substrate 700 having an insulating surface is prepared. The substrate 700 may be an non-alkali glass substrate such as a barium borosilicate glass, an aluminoborosilicate glass, and an aluminosilicate glass which are formed by fusion method and float method, a ceramic substrate, a plastic substrate which can resist the processing temperature during this step and the like. Further, a semiconductor substrate formed of single crystalline silicon and the like and a substrate provided with an insulating layer on the surface of a metal substrate such as stainless can be applied as well.

Next, a gate wiring 701 and a projection portion 702 are formed by selectively ejecting composition containing a conductive material on the substrate 700. The projection portion is provided in a region surrounded by a gate wiring and a source wiring, that is a display region in which pixel electrodes are formed. Note that the shape of the projection portion 702 is not particularly limited and its sectional surface in a diametrical direction may be polygonal or in an asymmetrical shape. For example, the projection portion 702 may have a columnar, prism, cone, or pyramid shape. Further, the projection portion 702 may be arranged regularly or irregularly.

Next, a gate insulating film 703 is formed in a single layer or laminated structure by plasma CVD or sputtering. The insulating film 703 is formed on a substrate on which a projection portion is formed and has projections and depressions on the surface.

Subsequently, a first semiconductor film, a second semiconductor film containing impurity elements, and a first conductive film are sequentially formed in lamination.

The first semiconductor film is formed of an AS or an SAS by vapor deposition or sputtering using semiconductor gas typified by silane and germane. The second semiconductor film containing impurity elements may be formed by using silane gas and phosphine gas and can be formed of an AS or an SAS.

Next, a mask is formed on the first conductive film by selectively ejecting composition, then the first semiconductor film, the second semiconductor film and the first conductive film are etched by using the mask. Thus, the first semiconductor film, the second semiconductor film and the first conductive film are patterned respectively.

After that, the second conductive film is formed on the entire surface by using a known method. Note that the second conductive film is formed by using a reflective conductive film. Further, the second conductive film may be formed by ejecting a conductive material.

Next, a mask is formed on the second conductive film by selectively ejecting composition, then a portion which is not covered with the mask is etched to form a semiconductor film 716, a source region 717, a drain region 718, a source electrode 719, a drain electrode 720, and a pixel electrode 705.

Thus, the insulating film formed on the projection portion 702 has projections and depressions on the surface. As the pixel electrode 705 is formed on the insulating film 703 having projections and depressions on the surface, the pixel electrode 705 can have projections and depressions on the surface, which scatters light.

According to this embodiment mode, a mask can be formed by selectively ejecting composition when forming a pixel TFT portion, which can omit a light exposure step using a photo mask. Conventionally, a step was required to be increased for forming projection and depression, however, projection is formed at the same time as the gate line by ejecting composition in this embodiment mode. Therefore, projection and depression can be formed on a pixel electrode without an additional step.

Embodiment Mode 8

In this embodiment mode, a simplified step for manufacturing an active matrix substrate in Embodiment Mode 1 is described with reference to FIGS. 11A to 11C.

First, the gate wiring layer 202, the gate electrode layer 203, and the capacitor wiring layer 204 are formed on the substrate 200 by selectively ejecting composition containing a conductive material. Next, the gate insulating film 205 is formed in a single layer or a laminated structure by plasma CVD or sputtering. Further, the semiconductor film 206 as an active layer and the N-type or P-type semiconductor film 207 as a semiconductor containing impurity elements of one conductivity type are formed. The aforementioned steps are similar to Embodiment Mode 1, therefore, a detailed description is omitted here.

Next, a conductive metal film 508 is formed on the semiconductor film 207 by selectively ejecting a conductive composition (FIG. 11A). The metal film 508 can be formed of a conductive composition containing metal particles such as Ag, Au, Cu, W, and Al as its main component. Further, indium tin oxide which transmits light, ITSO formed of indium tin oxide and silicon oxide, organic indium, organic tin, zinc oxide, titanium nitride and the like may be used in combination as well.

Next, the semiconductor films 206 and 207 which are not covered with the metal film 508 are etched with the metal film 508 as a mask, thereby a semiconductor film 511 and an N-type semiconductor film 512 are formed in a pixel TFT portion (FIG. 11B). Note that either of wet etching or dry etching may be used here, however, a method that does not corrode the metal film 508 is preferable.

Next, a light-transmitting conductive film 514 is formed on the entire surface by ejecting composition containing a conductive material, and then a mask 515 is formed by selectively ejecting composition. By etching with this mask 515, a semiconductor film 516, a source region 517, a drain region 518, a source electrode 519, a drain electrode 520, and a pixel electrode 521 are formed.

According to this embodiment mode, steps for forming a mask and removing the mask after etching are no longer required by selectively forming the metal film 508 and using it as a mask. Thus, a liquid crystal display panel can be formed by simpler steps.

Embodiment Mode 9

Next, a mode for mounting a driver circuit on a liquid crystal display panel formed according to the aforementioned embodiment mode is described with reference to FIGS. 17A, 17B, 18A, 18B, 19A and 19B.

Figure 17A:
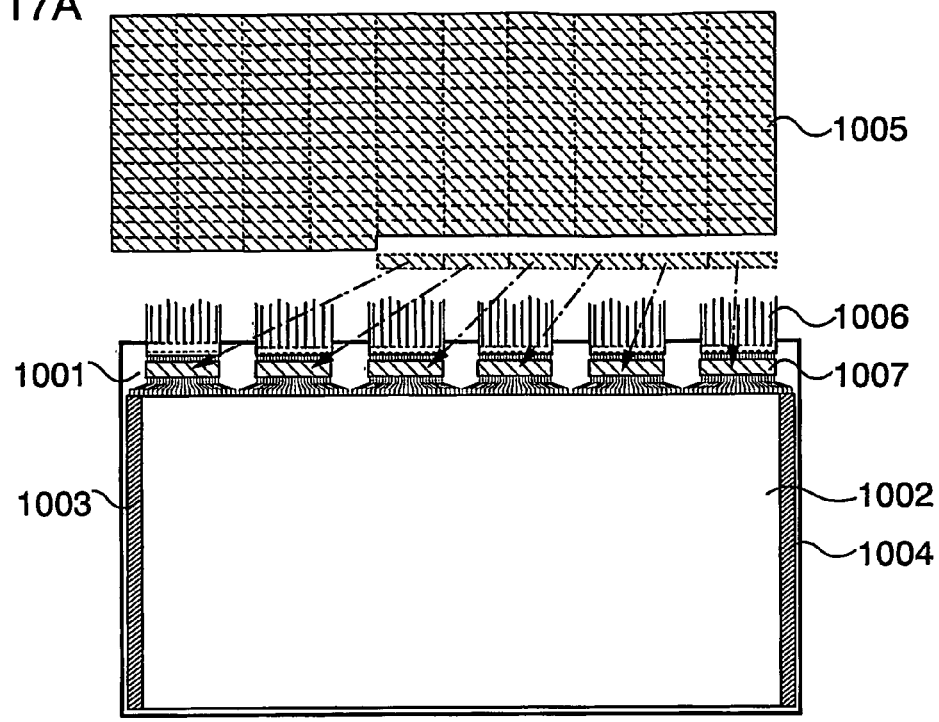
FIGS. 17A and 17B are diagrams showing methods for mounting a driver circuit of a liquid crystal display device of the invention.
Figure 17B:
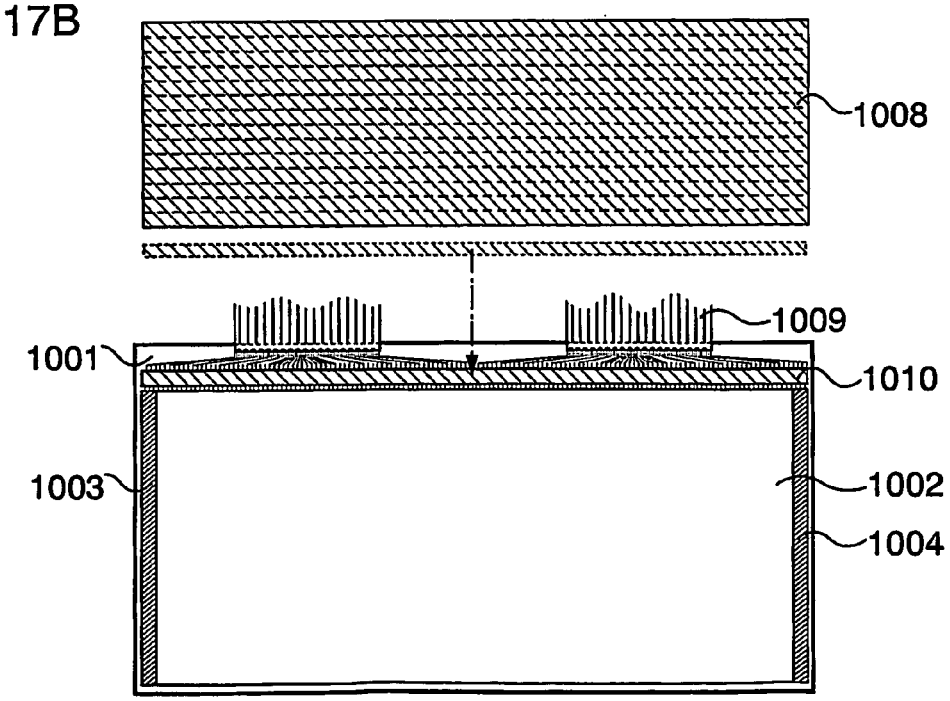

First, a description is made on a display device using COG with reference to FIGS. 17A and 17B. A pixel portion 1002 for displaying data such as text and an image, driver circuits 1003 and 1004 on a scan side and the like are provided on a substrate 1001. Substrates 1005 and 1008 provided with a plurality of driver circuits are divided into rectangular shapes and the divided driver circuits (hereinafter referred to as driver ICs) are mounted on the substrate 1001. FIG. 17A shows a mode for mounting a plurality of driver ICs 1007 of which ends are attached with tapes 1006. FIG. 17B shows a mode for mounting a driver IC 1010 of which ends are attached with tapes 1009.

Figure 18A:
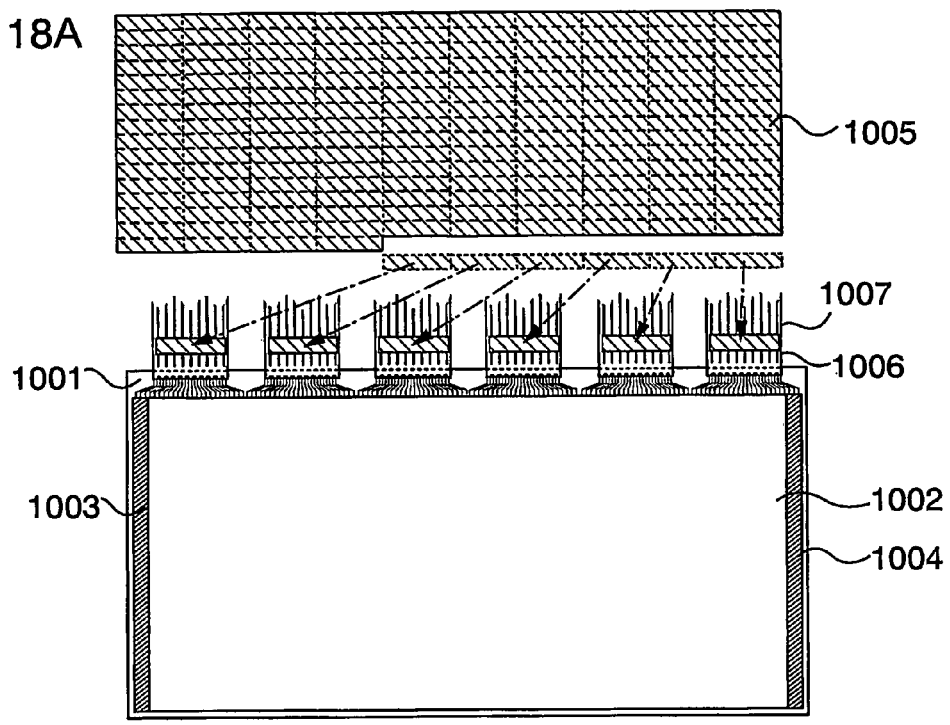
FIGS. 18A and 18B are diagrams showing methods for mounting a driver circuit of a liquid crystal display device of the invention.
Figure 18B:
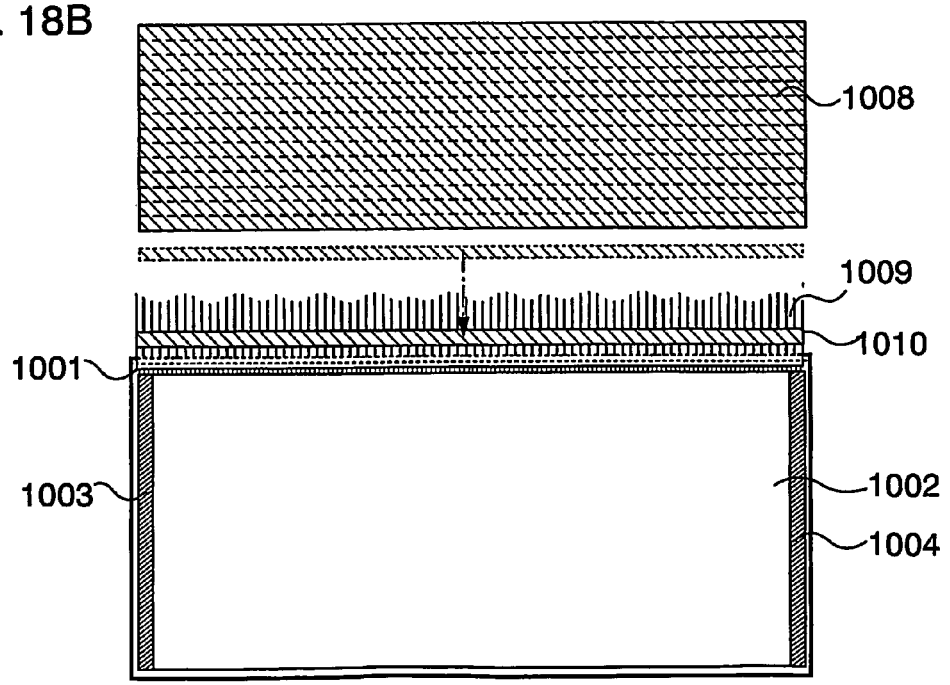

Next, a description is made on a display device using TAB with reference to FIGS. 18A and 18B. The pixel portion 1002, the driver circuits 1003 and 1004 on a scan side are provided on the substrate 1001. FIG. 18A shows a mode for attaching the tapes 1006 on the substrate 1001 and mounting driver ICs on the tapes 1006. FIG. 18B shows a mode for attaching the tape 1009 on the substrate 1001 and mounting the driver IC 1010 on the tape 1009. In the latter case, a metal piece for fixing the driver IC 1010 is preferably provided together for reinforcement.

It is preferable that these driver ICs mounted on a liquid crystal display device are formed in a plurality of numbers on the substrates 1005 and 1008 of which one side is 300 to 1000 mm or more in view of improving the productivity.

That is, a circuit pattern having a driver circuit portion and input and output terminals as one unit is formed in a plurality of numbers on the substrates 1005 and 1008 and may be divided to be separated. The long side of the driver IC may be determined in consideration of the length of one side of a pixel portion and a pixel pitch. The driver IC may have a rectangular shape of which long side is 15 to 80 mm and the short side is 1 to 6 mm as shown in FIGS. 17A and 18A. Alternatively, the driver IC may have a long side as long as one side of the pixel region 1002, or a length that added one side of the pixel portion 1002, and one sides of the driver circuits 1003 and 1004.

As shown in FIGS. 17A, 17B, 18A, and 18B, by forming driver ICs on a glass substrate, a long side in particular is not restricted in length, therefore, only a small number is required for mounting corresponding to the pixel portion 1002. That is, a driver IC formed of single crystalline silicon cannot be formed long due to a mechanical strength and depending on a substrate. By forming a driver IC on a glass substrate, shape of a mother substrate is not restricted, therefore, productivity is not decreased. This is a significant advantage as compared to the case of taking IC chips out of a circular silicon wafer.

In FIGS. 17A, 17B, 18A, and 18B, a driver IC 1007, 1008, or 1009 each having a driver circuit is mounted in an external region of the pixel region 1002. These driver ICs 1007 to 1009 are driver circuits on a signal line side. In order to form a pixel region corresponding to an RGB full color display, 3072 signal lines are required in XGA and 4800 signal lines are required in UXGA. The signal lines formed in such numbers are divided per few blocks at the end portion of the pixel region 1002 to obtain lead wirings, then gathered according to a pitch of output terminals of the driver ICs 1007 to 1009.

It is preferable that the driver IC is formed of a crystalline semiconductor formed on a substrate. The crystalline semiconductor is preferably formed by continuous laser irradiation. Therefore, a solid state laser or a gas laser of continuous oscillation is used for generating the laser light. With the continuous oscillation laser, a transistor can be formed by using a polycrystalline semiconductor layer having large grains with less crystal defects. Moreover, as mobility and response are good, high-speed drive can be performed, which results in improving the operation frequency of elements than the conventional one. Therefore, a high reliability can be obtained because of less variation in characteristics. It is preferable that a direction of channel length of a transistor and a scanning direction of the laser light to the substrate are the same in order to further improve operation frequency. In a laser crystallization step by using a continuous oscillation laser, the highest mobility can be obtained when the direction of a channel length of a transistor and a scanning direction of a laser light against the substrate are approximately parallel to each other (more preferably −30 to 30°). The direction of channel length is a direction of current flow in a channel formation region, that is a direction that a charge moves in other words. A transistor manufactured in this manner has an active layer formed of a polycrystalline semiconductor layer of which crystal grains extend in a direction of a channel, which implies that crystal grain boundary is formed approximately along the direction of the channel.

In order to perform laser crystallization, it is preferable that the laser light be sharply focused to have a beam width of 1 to 3 mm approximately which is as long as a short side of the driver IC. Further, it is preferable that the irradiation region of laser light be linear in order to secure a sufficient and effective energy density. However, linear here does not mean a line in the strict sense but means a large rectangle or an oblong having a large aspect ratio, for example, the one having two or more of aspect ratio (more preferably 10 to 10000). In this manner, when a width of a beam spot of a laser light is as long as a short side of a driver IC, a manufacturing method of a display device of which productivity is improved can be provided.

In FIGS. 17A, 17B, 18A, and 18B, scan line driver circuits and a pixel portion are integrally formed, and a driver IC is mounted as a signal line driver circuit. However, the invention is not limited to this mode and driver ICs may be mounted as both of the scan line driver circuit and the signal line driver circuit. In that case, driver ICs having different specifications are preferably used on a scan line side and a signal line side.

In the pixel region 1002, signal lines and scan lines cross each other to form a matrix and transistors are disposed corresponding to each intersection portion. According to the invention, a TFr of which channel portion is formed of amorphous semiconductor or semi-amorphous semiconductor are used as transistors disposed in the pixel portion 1002. The amorphous semiconductor is formed by plasma CVD, sputtering and the like. The semi-amorphous semiconductor can be formed by plasma CVD at 300° C. or lower. A non-alkali glass substrate having a size of 550×650 mm, for example, can be formed in a thickness required for forming transistors in a short time. Such features of a manufacturing technology are efficient in manufacturing a display device having a large display. Moreover, by forming a channel formation region by an SAS, the semi-amorphous TFT can obtain electric field mobility of 2 to 10 cm$^2$/V sec. Therefore, this TFT can be used as a switching element in a pixel and an element which constitutes a driver circuit on a scan line side. Therefore, a liquid crystal display panel that realizes system on panel can be manufactured.

Note that by using a TFT of which semiconductor layer is formed of an SAS, a scan line driver circuit is integrally formed on a substrate as well in FIGS. 17A, 17B, 18A and 18B. In the case of using a TFT of which semiconductor layer is formed of AS, driver ICs may be mounted as both of the scan line driver circuit and the signal line driver circuit.

In that case, it is preferable that the driver ICs having different specifications are used on the scan line side and the signal line side. For example, a transistor which constitutes the driver IC on the scan line side is required withstand a pressure of 30 V approximately, whereas a driving frequency thereof is 100 kHz or less and a high speed operation is not so much required. Therefore, it is preferable that a channel length (L) of a transistor which constitutes a scan line driver is long enough. On the other hand, a transistor which constitutes the driver IC on the signal line side is required to withstand a pressure of only about 12 V, whereas a driving frequency is about 65 MHz with 3 V and a high speed operation is required. Therefore, it is preferable that a channel length of the transistor which constitutes the driver and the like are set by using micron rule.

Figure 19A:
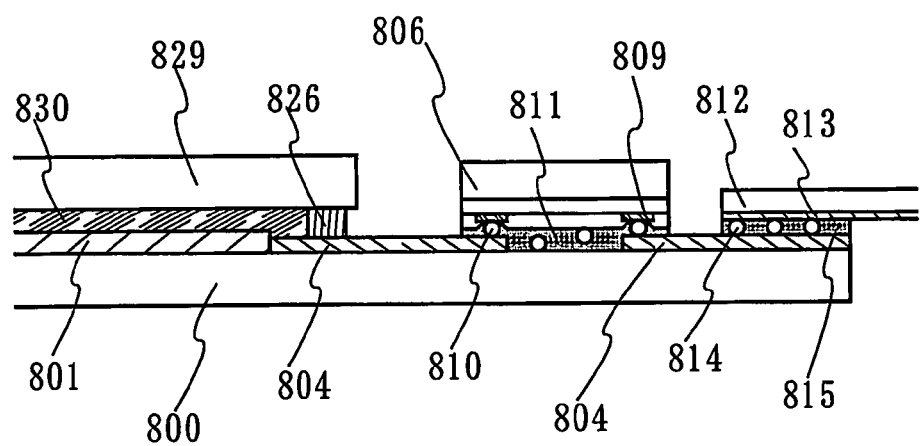
FIGS. 19A and 19B are diagrams showing methods for mounting a driver circuit of a liquid crystal display device of the invention.
Figure 19B:
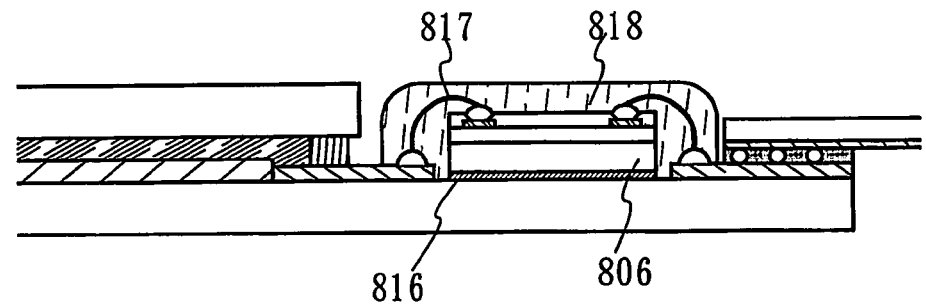

FIGS. 19A and 19B show structures for mounting a driver IC by COG. FIG. 19A shows a structure that a driver IC 806 is mounted on a TFT substrate 800 by using anisotropic conductive material. A pixel region 801 and an input terminal 804 on a signal line side (an input terminal on a scan line side is similar) are provided on the TFT substrate 800. A counter substrate 829 is adhered to the TFT substrate 800 with a sealing material 826, sandwiching a liquid crystal layer 830.

An FPC 812 is adhered to the input terminal 804 on the signal line side by anisotropic conductive material. The anisotropic conductive material is formed of resin 815 and conductive particles 814 of which diameter is tens to hundreds μm of which surface is plated with Au and the like. The signal line input terminal 104 and the wiring 813 formed on the FPC 812 are electrically connected through the conductive particles 814. The driver IC 806 is adhered on the TFT substrate 800 by anisotropic conductive material and input and output terminals 809 provided on the driver IC 806 and the input terminal 804 on the signal line side are electrically connected through conductive particles 810 mixed in resin 811.

Further, as shown in FIG. 19B, the driver IC 806 may be fixed on the TFT substrate 800 with an adhesive 816, and input and output terminals of the driver IC and a lead wiring or a connecting wiring may be connected by an Au wire 817. Then, sealing resin 818 is used for sealing. Note that a mounting method of the driver IC is not particularly limited and a known COG, wire bonding, or TAB can be used as well.

With the driver IC being as thick as a counter substrate, a height of the space between them becomes approximately the same and a display device as a whole can be formed thin. Further, by forming each substrate by using the same material, a thermal stress is not generated even when a temperature of the display device changes, thus the characteristics of a circuit formed of TFTs are not damaged. Moreover, by mounting a driver circuit of a driver IC which is longer than an IC chip as shown in this embodiment mode, the number of driver ICs to be mounted in one pixel region can be reduced.

As described above, a driver circuit can be incorporated in a liquid crystal display panel.

Embodiment Mode 10

Figure 23:
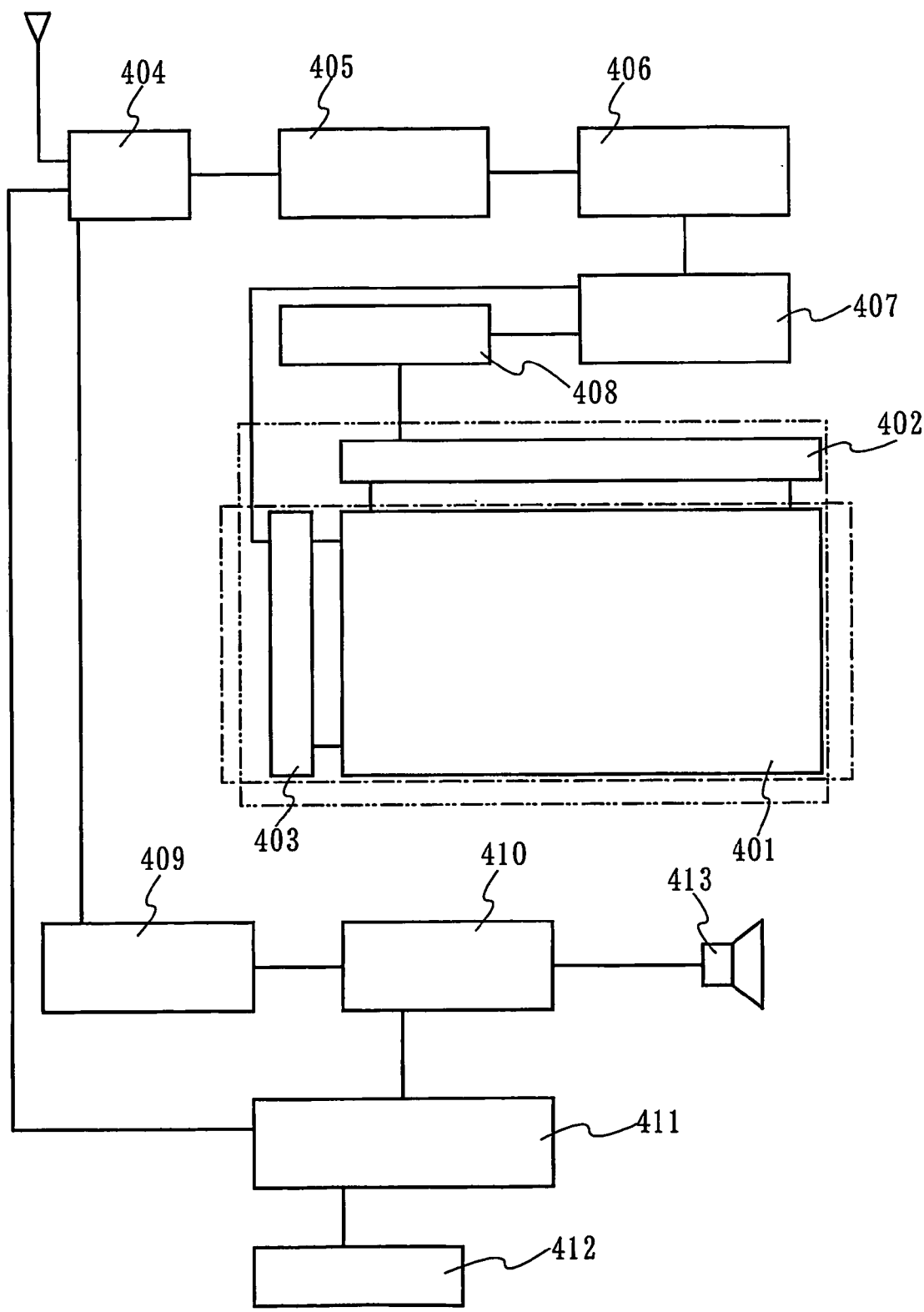
FIG. 23 is a block diagram showing a major structure of a receiver of a liquid crystal display device of the invention.

With a liquid crystal display panel manufactured according to Embodiment Mode 9, a liquid crystal television receiver can be completed. FIG. 23 is a block diagram showing a major structure of a liquid crystal television receiver. In the liquid crystal display panel, a pixel portion 401 only is formed and a scan line driver circuit 403 and a signal line driver circuit 402 are mounted by TAB as shown in FIG. 20, or the scan line driver circuit 403 and the signal line driver circuit 402 are mounted on the periphery of the pixel portion 401 by COG as shown in FIG. 21. Otherwise, a TFT is formed of an SAS, the pixel portion 401 and the scan line driver circuit 403 are integrally formed on a substrate, and the signal line driver circuit 402 is mounted as a driver IC as shown in FIG. 22. The invention can employ any of these modes.

As other external circuits, an image signal amplifier circuit 405 which amplifies image signals among the signals received by a tuner 404, an image signal processing circuit 406 which converts the outputted signals to color signals corresponding to each of red, green and blue, a control circuit 407 which converts the image signals for inputting to a driver IC, and the like are provided. The control circuit 407 outputs signals to the scan line side and the signal line side. When performing a digital drive, a signal dividing circuit 408 is provided on the signal line side to divide input digital signals into m-pieces to be supplied.

Among the signals received by the tuner 404, an audio signal is sent to an audio signal amplifier circuit 409 and the outputted signal is supplied to a speaker 413 through an audio signal processing circuit 410. The control circuit 411 receives data of a receiving station (receiving frequency) and audio control from an input portion 412 and send them to the tuner 404 and the audio signal processing circuit 410.

Figure 24:
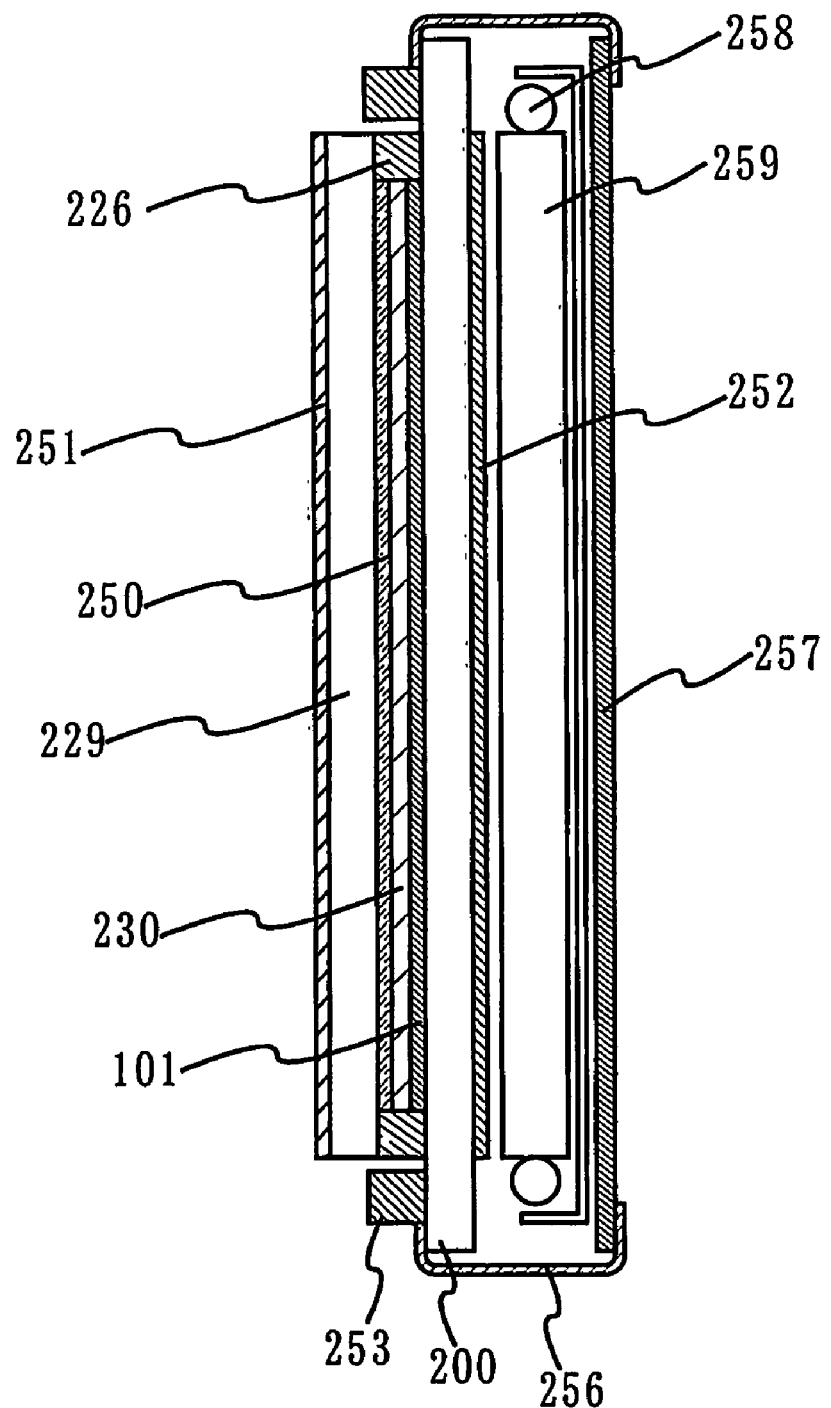
FIG. 24 is a diagram showing a structure of a liquid crystal display device of the invention.

FIG. 24 is an example of a liquid crystal display module in which a TFT substrate 200 and a counter substrate 229 are fixed by a sealing material 226, sandwiching the pixel portion 101 and the liquid crystal layer 230 to form a display region. A colored layer 250 is required for performing a color display. In the case of an RGB method, a colored layer corresponding to each of red, green and blue is provided for each pixel correspondingly. Polarizers 251 and 252 are provided outside of the TFT substrate 200 and the counter substrate 229. A light source is constituted by a cold cathode tube 258 and a light guide 259. A circuit substrate 257 is connected to the TFT substrate 200 by a flexible wiring substrate 256 and incorporated with external circuits such as a control circuit and a power source circuit.

Figure 25:
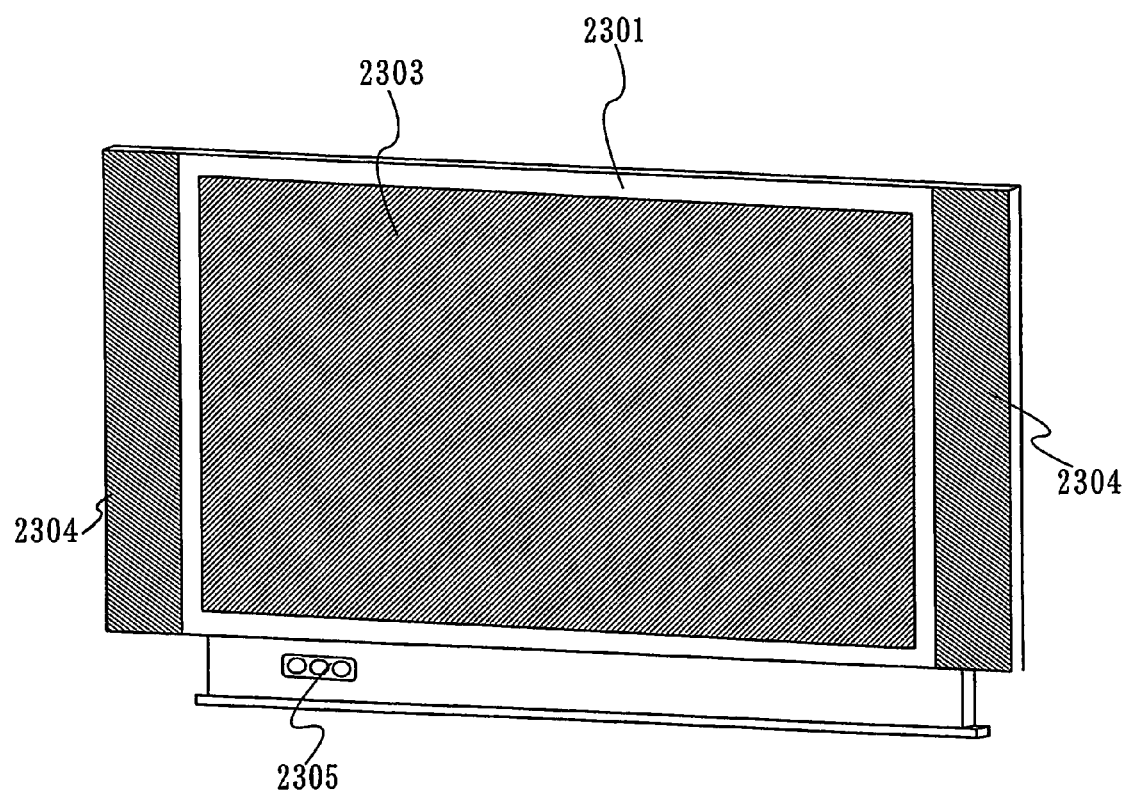
FIG. 25 is a view of an example of an electronic apparatus completed by the invention.

FIG. 25 shows a television receiver completed by incorporating the aforementioned liquid crystal display module in a housing 2301. A display screen 2303 is completed by the liquid display module and provided with speakers 2304, an operating switch 2305 and the like as accessory equipment. In this manner, a television receiver can be completed according to the invention.

It is needless to say that the invention is not limited to a television receiver and can be used in various applications in particular as a large display medium such as a monitor of a personal computer, an information display in train stations, airports and the like, advertisement display on the streets.

This application is based on Japanese Patent Application serial no. 2003-386013 filed in Japan Patent Office on Nov. 14, 2003, the contents of which are hereby incorporated by reference.

The invention claimed is:

1. A liquid crystal display device comprising:
   a conductive layer over an insulating surface;
   a gate electrode formed on the conductive layer;
   a semiconductor film formed on the gate electrode sandwiching an insulating film;
   a source region and a drain region formed on the semiconductor film;
   a source electrode formed over the source region;
   a drain electrode formed over the drain region;
   a barrier film formed so as to cover at least portions of an end surface of the source electrode, an end surface of the drain electrode, an end surface of the source region, an end surface of the source region, an end surface of the drain region, and an end surface of the semiconductor film; and
   a pixel electrode formed so as to cover the drain electrode and the barrier film,
   wherein at least a portion of an end surface of the source region approximately corresponds to an end surface of the semiconductor film and an end surface of the source electrode; and
   wherein at least a portion of an end surface of the drain region approximately corresponds to an end surface of the semiconductor film and an end surface of the drain electrode, and
   wherein a portion of the conductive layer which is not overlapped with the gate electrode is oxidized and insulated.

2. A liquid crystal display device comprising:
   a conductive layer over an insulating surface;
   a gate electrode formed on the conductive layer;
   a semiconductor film formed on the gate electrode sandwiching an insulating film;
   a source region and a drain region formed on the semiconductor film;
   a source electrode formed over the source region;
   a drain electrode formed over the drain region;
   a barrier film formed so as to cover at least portions of an end surface of the source electrode, an end surface of the drain electrode, an end surface of the source region, an end surface of the source region, an end surface of the drain region, and an end surface of the semiconductor film; and a pixel electrode formed so as to cover the drain electrode and the barrier film, wherein one end surface of the drain region approximately corresponds to an end surface of the semiconductor film and an end surface of the drain electrode and the other end surface approximately corresponds to an end surface of the pixel electrode and the other end surface of the drain electrode, and wherein a portion of the conductive layer which is not overlapped with the gate electrode is oxidized and insulated.

3. The liquid crystal display device according to claim 1, wherein the pixel electrode is formed of a light-transmitting conductive film.

4. The liquid crystal display device according to claim 2, wherein the pixel electrode is formed of a light-transmitting conductive film.

5. The liquid crystal display device according to claim 1, wherein the pixel electrode is formed of a conductive film containing Ag (silver), Au (gold), Cu (copper), W (tungsten), and Al (aluminum) as its main component, or a lamination thereof.

6. The liquid crystal display device according to claim 2, wherein the pixel electrode is formed of a conductive film containing Ag (silver), Au (gold), Cu (copper), W (tungsten), and Al (aluminum) as its main component, or a lamination thereof.

7. The liquid crystal display device according to claim 1, wherein the semiconductor film is a semi-amorphous semiconductor containing hydrogen and halogen element, and a crystalline structure.

8. The liquid crystal display device according to claim 2, wherein the semiconductor film is a semi-amorphous semiconductor containing hydrogen and halogen element, and a crystalline structure.

9. A method for manufacturing a liquid crystal display device comprising:

forming a conductive layer over an insulating surface;

forming a gate electrode by selectively ejecting composition on the conductive layer;

oxidizing a portion of the conductive layer which is not overlapped with the gate electrode;

forming an insulating film so as to cover the gate electrode;

forming a first semiconductor film on the insulating film;

forming a second semiconductor film containing an impurity element which imparts N-type or P-type on the first semiconductor film;

forming a first conductive film on the second semiconductor film;

forming a pattern of laminated films of the first semiconductor film, the second semiconductor film and the first conductive film by selectively removing the first semiconductor film, the second semiconductor film and the first conductive film by using a first mask;

forming a second conductive film so as to cover the laminated films; and forming a source region and a drain region formed of the second semiconductor film, a source electrode and a drain electrode formed of the first conductive film, and a pixel electrode formed of the second conductive film by selectively removing a portion of the first semiconductor film, the second semiconductor film, the first conductive film and the second conductive film.

10. A method for manufacturing a liquid crystal display device comprising:

forming a conductive layer over an insulating surface;

forming a gate electrode by selectively ejecting composition on the conductive layer;

oxidizing a portion of the conductive layer which is not overlapped with the gate electrode;

forming an insulating film so as to cover the gate electrode;

forming a first semiconductor film on the insulating film;

forming a second semiconductor film containing an impurity element which imparts N-type or P-type on the first semiconductor film;

forming a first conductive film on the second semiconductor film;

forming a pattern of laminated films of the first semiconductor film, the second semiconductor film and the first conductive film by selectively removing the first semiconductor film, the second semiconductor film and the first conductive film by using a first mask;

forming a barrier film by selectively ejecting composition on an end surface of the laminated films;

forming a second conductive film so as to cover the laminated films and the barrier film; and forming a source region and a drain region formed of the second semiconductor film, a source electrode and a drain electrode formed of the first conductive film, and a pixel electrode formed of the second conductive film by selectively removing a portion of the first semiconductor film, the second semiconductor film, the first conductive film and the second conductive film.

11. The method for manufacturing a liquid crystal display device according to claim 9; wherein the insulating film, the first semiconductor film, the second semiconductor film and the first conductive film are formed sequentially without being exposed to atmosphere.

12. The method for manufacturing a liquid crystal display device according to claim 10; wherein the insulating film, the first semiconductor film, the second semiconductor film and the first conductive film are formed sequentially without being exposed to atmosphere.

13. A method for manufacturing a liquid crystal display device according to claim 9, wherein the first mask and the second mask are formed by selectively ejecting composition.

14. A method for manufacturing a liquid crystal display device according to claim 10, wherein the first mask and the second mask are formed by selectively ejecting composition.

15. The method for manufacturing a liquid crystal display device according to claim 9, wherein the second conductive film is formed by selectively ejecting composition.

16. The method for manufacturing a liquid crystal display device according to claim 10, wherein the second conductive film is formed by selectively ejecting composition.

17. A method for manufacturing a liquid crystal display device comprising:

forming a conductive layer over an insulating surface;

forming a gate electrode by selectively ejecting composition on the conductive layer;

oxidizing a portion of the conductive layer which is not overlapped with the gate electrode;

forming an insulating film so as to cover the gate electrode;

forming a first semiconductor film on the insulating film;

forming a second semiconductor film containing an impurity element which imparts N-type or P-type on the first semiconductor film;

forming a first conductive film by selectively ejecting composition on the second semiconductor film;

forming a pattern of laminated films of the first semiconductor film, the second semiconductor film and the first conductive film by selectively removing the first semiconductor film, the second semiconductor film by using the first conductive film as a first mask;

forming a second conductive film so as to cover the laminated films; and forming a source region and a drain region formed of the second semiconductor film, a source electrode and a drain electrode formed of the first conductive film, and a pixel electrode formed of the second conductive film by selectively removing a portion of the first semiconductor film, the second semiconductor film, the first conductive film and the second conductive film by using a mask.

18. The liquid crystal display device according to claim 1, wherein the barrier film is formed of a resin material selected from the group consisting of epoxy resin, acryl resin, phenol resin, novolac resin, melamine resin, and urethane resin.

19. The liquid crystal display device according to claim 2, wherein the barrier film is formed of a resin material selected from the group consisting of epoxy resin, acryl resin, phenol resin, novolac resin, melamine resin, and urethane resin.

20. The method for manufacturing a liquid crystal display device according to claim 10, wherein the barrier film is formed of a resin material selected from the group consisting of epoxy resin, acryl resin, phenol resin, novolac resin, melamine resin, and urethane resin.

21. The liquid crystal display device according to claim 1, wherein the conductive layer comprises a metal material selected from the group consisting of Ti, W, Cr, Al, Ta, Ni, Zr, Hf, V, Ir, Nb, Pd, Pt, Mo, Co, and Rh.

22. The liquid crystal display device according to claim 2, wherein the conductive layer comprises a metal material selected from the group consisting of Ti, W, Cr, Al, Ta, Ni, Zr, Hf, V, Ir, Nb, Pd, Pt, Mo, Co, and Rh.

23. The liquid crystal display device according to claim 1, wherein the conductive layer is formed by sputtering or vapor deposition.

24. The liquid crystal display device according to claim 2, wherein the conductive layer is formed by sputtering or vapor deposition.

25. The method for manufacturing a liquid crystal display device according to claim 9, wherein the conductive layer comprises a metal material selected from the group consisting of Ti, W, Cr, Al, Ta, Ni, Zr, Hf, V, Ir, Nb, Pd, Pt, Mo, Co, and Rh.

26. The method for manufacturing a liquid crystal display device according to claim 10, wherein the conductive layer comprises a metal material selected from the group consisting of Ti, W, Cr, Al, Ta, Ni, Zr, Hf, V, Ir, Nb, Pd, Pt, Mo, Co, and Rh.

27. The method for manufacturing a liquid crystal display device according to claim 17, wherein the conductive layer comprises a metal material selected from the group consisting of Ti, W, Cr, Al, Ta, Ni, Zr, Hf, V, Ir, Nb, Pd, Pt, Mo, Co, and Rh.

28. The method for manufacturing a liquid crystal display device according to claim 9, wherein the conductive layer is formed by sputtering or vapor deposition.

29. The method for manufacturing a liquid crystal display device according to claim 10, wherein the conductive layer is formed by sputtering or vapor deposition.

30. The method for manufacturing a liquid crystal display device according to claim 17, wherein the conductive layer is formed by sputtering or vapor deposition.

* * * * *